(12) United States Patent
Lin et al.

(10) Patent No.: US 11,610,954 B1
(45) Date of Patent: Mar. 21, 2023

(54) OLED PANEL WITH ADVANCED SUB-PIXEL OVERHANGS

(71) Applicant: Applied Materials, Inc., Santa Clara, CA (US)

(72) Inventors: Yu-Hsin Lin, Zhubei (TW); Ji-Young Choung, Hwaseong-si (KR); Chung-Chia Chen, Hsinchu (TW); Jungmin Lee, Santa Clara, CA (US); Wen-Hao Wu, San Jose, CA (US); Takashi Anjiki, Bayern (DE); Takuji Kato, Yokohama (JP); Dieter Haas, San Jose, CA (US); Si Kyoung Kim, Gwangju-si (KR); Stefan Keller, Mainaschaff (DE)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/744,364

(22) Filed: May 13, 2022

Related U.S. Application Data

(60) Provisional application No. 63/268,157, filed on Feb. 17, 2022, provisional application No. 63/267,987, filed on Feb. 14, 2022.

(51) Int. Cl.
*H01L 27/32* (2006.01)
*H01L 51/52* (2006.01)

(52) U.S. Cl.
CPC ...... *H01L 27/3246* (2013.01); *H01L 27/3283* (2013.01); *H01L 51/5225* (2013.01); *H01L 51/5253* (2013.01)

(58) Field of Classification Search
CPC ............. H01L 27/3246; H01L 27/3283; H01L 51/5225; H01L 51/5253
See application file for complete search history.

(56) References Cited

U.S. PATENT DOCUMENTS 6,060,728 A  5/2000  Ghosh et al.
6,137,220 A  10/2000  Nagayama et al.
(Continued)

FOREIGN PATENT DOCUMENTS

CN  105742311 B  11/2018
JP  2016225319 A  12/2016

OTHER PUBLICATIONS

International Search Report/Written Opinion issued to PCT/US2021/021097 dated Jul. 1, 2021.
(Continued)

*Primary Examiner* — Shaun M Campbell
(74) *Attorney, Agent, or Firm* — Patterson + Sheridan, LLP

(57) ABSTRACT

Embodiments described herein relate to a device including a substrate, a plurality of adjacent pixel-defining layer (PDL) structures disposed over the substrate, and a plurality of sub-pixels. Each sub-pixel includes adjacent first overhangs, adjacent second overhangs, an anode, a hole injection layer (HIL) material, an additional organic light emitting diode (OLED) material, and a cathode. Each first overhang is defined by a body structure disposed over and extending laterally past a base structure disposed over the PDL structure. Each second overhang is defined by a top structure disposed over and extending laterally past the body structure. The HIL material is disposed over and in contact with the anode and disposed under the adjacent first overhangs. The additional OLED material is disposed over the HIL material and extends under the first overhang.

27 Claims, 14 Drawing Sheets

(56) References Cited

U.S. PATENT DOCUMENTS

| | | | |
|---|---|---|---|
| 6,476,988 B1 | 11/2002 | Yudasaka | |
| 8,686,629 B2 | 4/2014 | Oh et al. | |
| 8,987,717 B2 | 3/2015 | Kang | |
| 9,324,962 B2 | 4/2016 | Kim | |
| 9,337,244 B2 | 5/2016 | Hatano et al. | |
| 10,170,526 B1 | 1/2019 | Yang | |
| 10,580,843 B2 | 3/2020 | Zhao et al. | |
| 10,615,231 B2 | 4/2020 | Wu et al. | |
| 11,348,983 B1* | 5/2022 | Choung | H01L 51/0008 |
| 2002/0014836 A1 | 2/2002 | Codama et al. | |
| 2003/0006697 A1 | 1/2003 | Weaver | |
| 2006/0170340 A1 | 8/2006 | Tzen et al. | |
| 2009/0009069 A1 | 1/2009 | Takata | |
| 2012/0217516 A1* | 8/2012 | Hatano | H01L 51/525 |
| | | | 257/E33.062 |
| 2012/0228603 A1 | 9/2012 | Nakamura | |
| 2014/0103385 A1* | 4/2014 | Hatano | H01L 33/005 |
| | | | 438/28 |
| 2014/0131743 A1 | 5/2014 | Jiang et al. | |
| 2019/0058020 A1 | 2/2019 | Tsai et al. | |
| 2019/0088730 A1 | 3/2019 | Lee et al. | |
| 2019/0348482 A1 | 11/2019 | Bae et al. | |
| 2020/0119114 A1 | 4/2020 | Kim et al. | |
| 2021/0135150 A1 | 5/2021 | Wang et al. | |
| 2021/0397302 A1* | 12/2021 | Yang | G06F 3/0445 |
| 2022/0077251 A1* | 3/2022 | Choung | H01L 51/5237 |
| 2022/0077252 A1* | 3/2022 | Choung | H01L 51/5228 |
| 2022/0077257 A1* | 3/2022 | Choung | H01L 27/3283 |

OTHER PUBLICATIONS

International Search Report/Written Opinion issued to PCT/US2021/021077 dated Jun. 23, 2021.

* cited by examiner

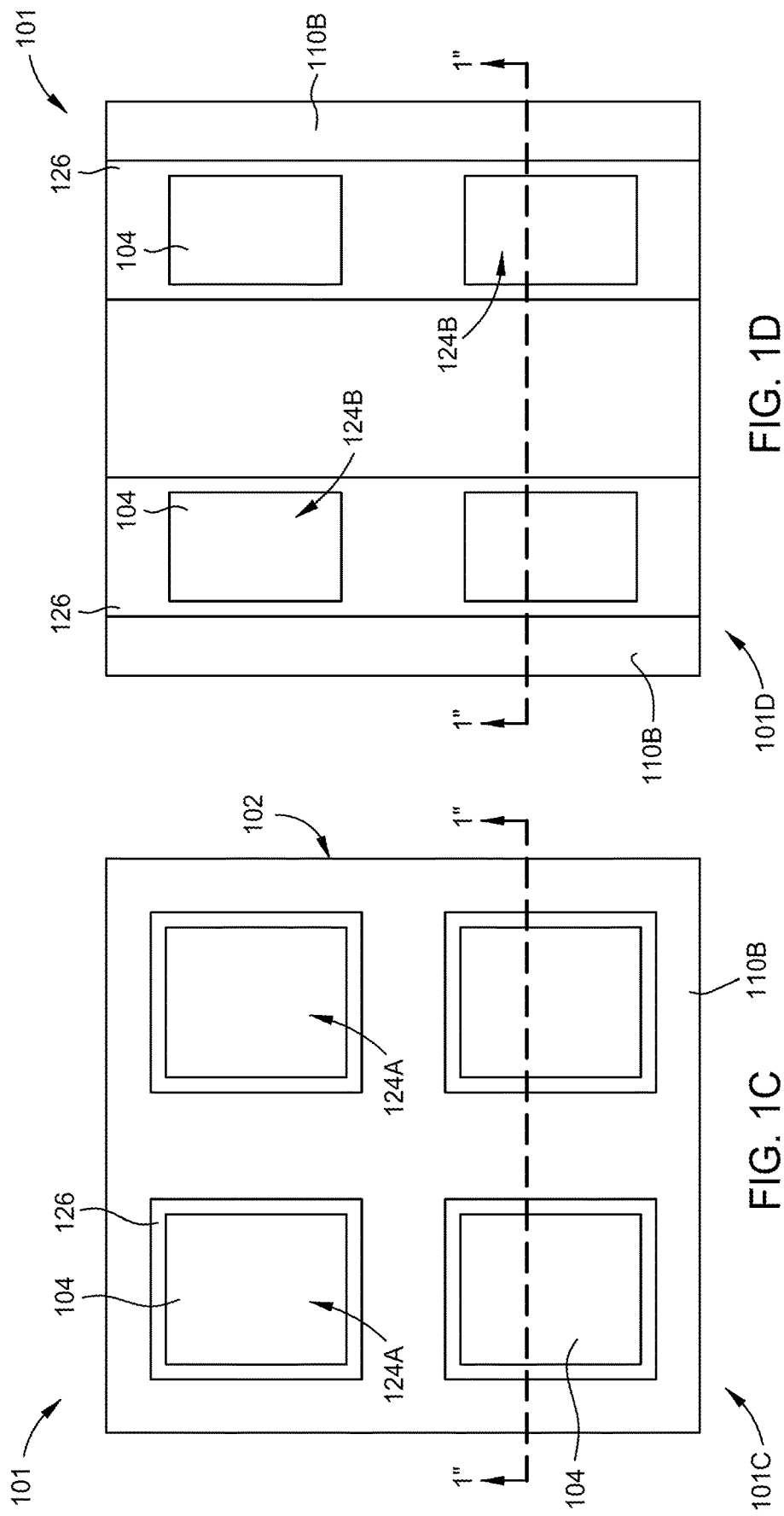

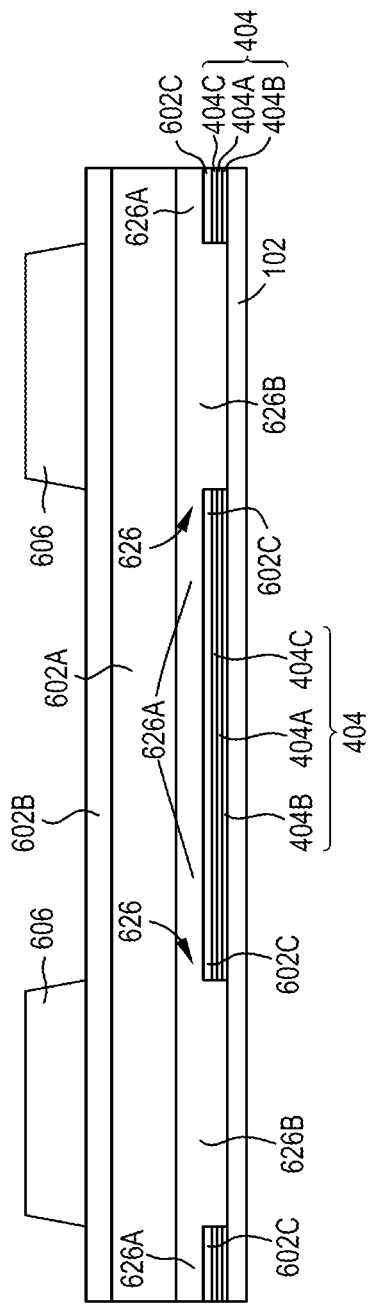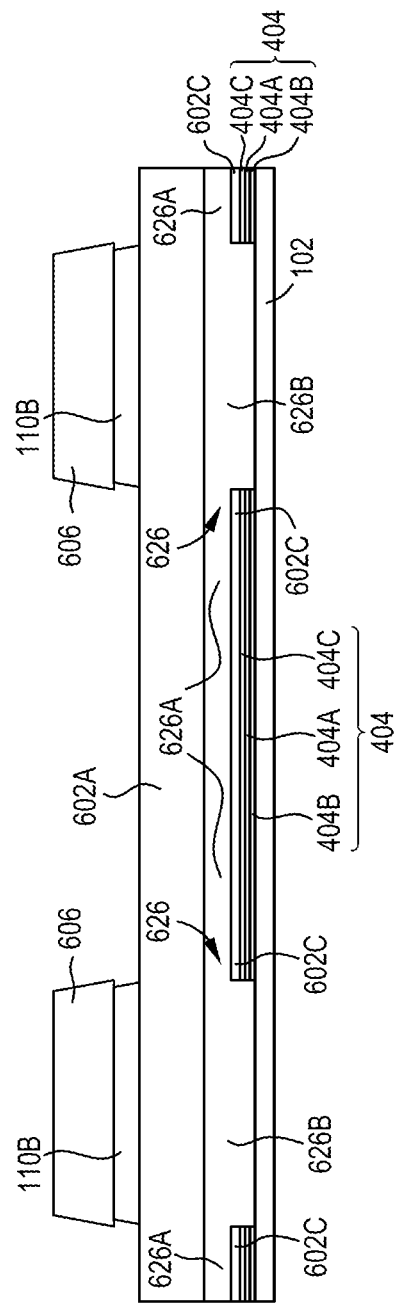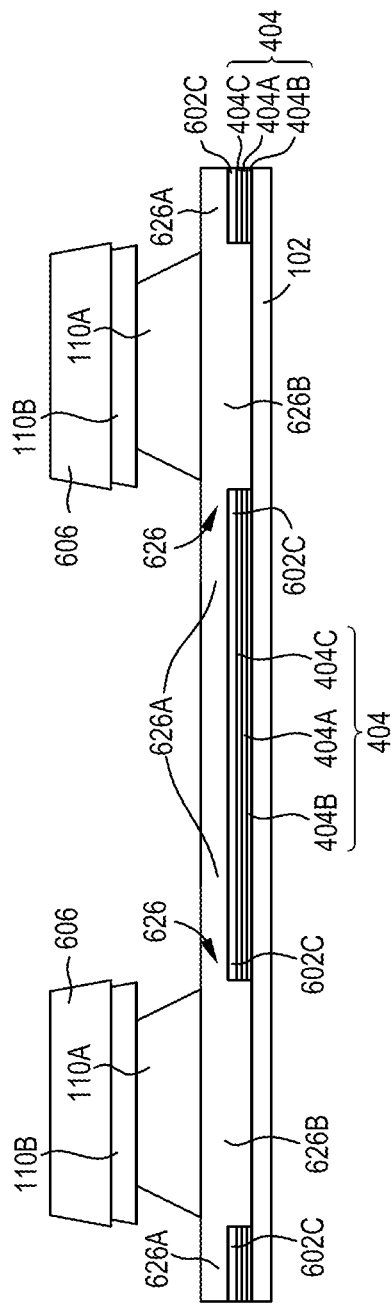

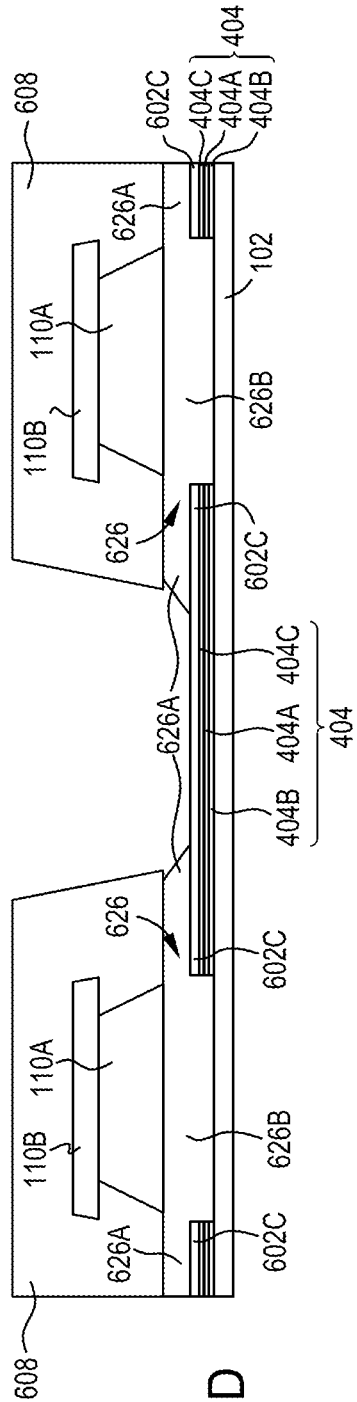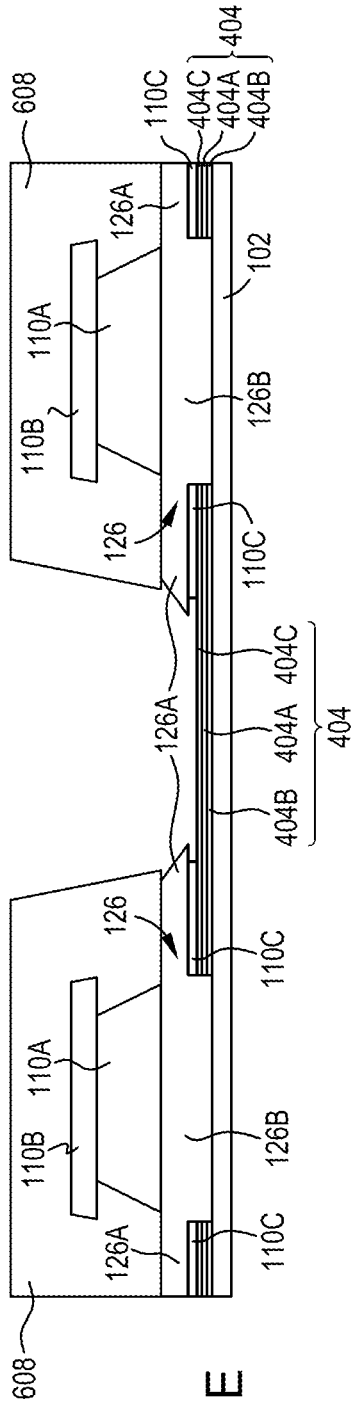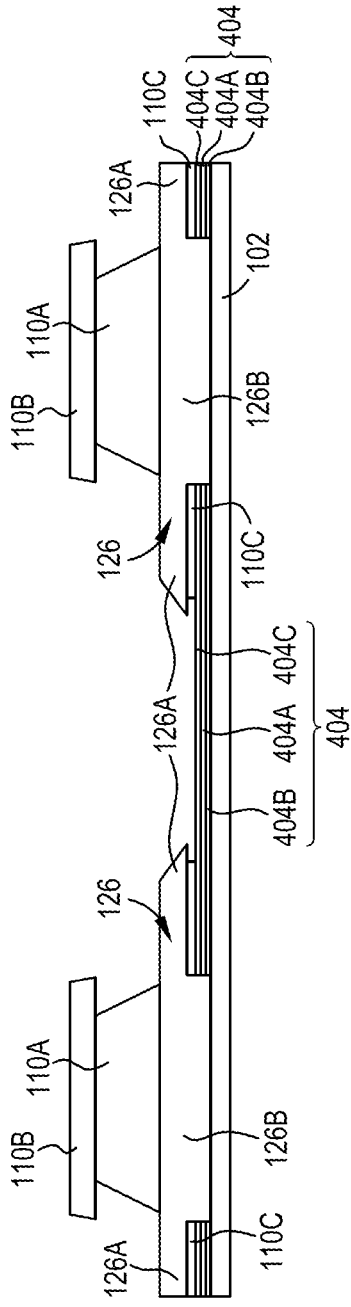

OLED PANEL WITH ADVANCED SUB-PIXEL OVERHANGS

CROSS-REFERENCE TO RELATED APPLICATIONS

This application claims priority to U.S. Provisional Patent Application Ser. No. 63/267,987, filed on Feb. 14, 2022 and 63/268,157, filed on Feb. 17, 2022, which are herein incorporated by reference.

BACKGROUND

Field

Embodiments described herein generally relate to a display. More specifically, embodiments described herein relate to sub-pixel circuits and methods of forming sub-pixel circuits that may be utilized in a display such as an organic light-emitting diode (OLED) display.

Description of the Related Art

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semi-transparent bottom electrode and substrate on which the panel was manufactured. Top emission devices are classified based on whether or not the light emitted from the OLED device exits through the lid that is added following the fabrication of the device. OLEDs are used to create display devices in many electronics today. Today's electronics manufacturers are pushing these display devices to shrink in size while providing higher resolution than just a few years ago.

OLED pixel patterning is currently based on a process that restricts panel size, pixel resolution, and substrate size. Rather than utilizing a fine metal mask, photo lithography should be used to pattern pixels. Currently, OLED pixel patterning requires lifting off organic material after the patterning process. When lifted off, the organic material leaves behind a particle issue that disrupts OLED performance. Accordingly, what is needed in the art are sub-pixel circuits and methods of forming sub-pixel circuits to increase pixel-per-inch and provide improved OLED performance.

SUMMARY

In one embodiment, a device is provided. The device includes a substrate and a plurality of adjacent pixel-defining layer (PDL) structures disposed over the substrate. Each PDL structure includes an upper surface and a plurality of sub-pixels. Each sub-pixel includes adjacent first overhangs, each first overhang defined by a body extension of a body structure extending laterally past a base structure. The base structure is disposed over the upper surface of the PDL structure, and the body structure is disposed over the base structure. Adjacent second overhangs are defined by a top extension of a top structure extending laterally past an overhang portion of the body extension. The top structure is disposed over the body structure. The sub-pixel further includes an anode and a hole injection layer (HIL) material disposed over and in contact with the anode and disposed under the adjacent first overhangs. Further, an additional organic light emitting diode (OLED) material is disposed over the HIL material. The additional OLED material is disposed over a first portion of the body extension, and a cathode is disposed over the additional OLED material. The cathode extends under the adjacent second overhangs and contacts a second portion of the body extension.

In another embodiment, a device is provided. The device has a plurality of sub-pixels, each sub-pixel includes a section of a substrate and at least one metal-containing layer disposed over the substrate. Adjacent first overhangs are each defined by a pixel-defining layer (PDL) extension of a PDL structure extending laterally past a base structure. The base structure is disposed over an upper surface of the at least one metal-containing layer. The PDL extension is disposed over the base structure and a PDL body of the PDL structure is disposed over the substrate. A body structure is disposed over the upper surface of the PDL structure. Adjacent second overhangs are each defined by a top extension of a top structure extending laterally past an overhang portion of a body extension of a body structure. The top structure is disposed over the body structure, and the body structure is disposed over the PDL structure. A hole injection layer (HIL) material is disposed over and in contact with the at least one metal-containing layer and disposed under the adjacent first overhangs. An additional organic light emitting diode (OLED) material disposed over the HIL material. The additional OLED material is disposed over a first portion of the body extension structure. A cathode is disposed over the additional OLED material, the cathode extending under the adjacent second overhangs and contacting a second portion of the body extension structure.

In another embodiment, a device is provided. The device includes a substrate and a plurality of adjacent pixel-defining layer (PDL) structures disposed over the substrate. A plurality of adjacent overhang structures are disposed over an upper surface of the PDL structures. Each of the overhang structures includes a base structure disposed over an upper surface of the PDL structures, a body structure disposed over the base structure, and a top structure disposed over the base structure. The base structure includes a non-conductive material. The body structure includes a conductive material. The top structure includes a top extension extending laterally past the body structure. The device further includes a plurality of sub-pixels, each subpixel including an anode, a hole injection layer (HIL) material disposed over and in contact with the anode, an additional organic light emitting diode (OLED) material disposed over the HIL material, and a cathode disposed over the additional OLED material. The HIL material extends under the top extension and contacts a first portion of the non-conductive material of the base structure. The cathode is disposed over the additional OLED material, and extends under the adjacent overhangs and contacts the conductive material at a sidewall of the body structure.

In yet another embodiment, a device is provided. The device includes a substrate, a plurality of first adjacent pixel-defining layer (PDL) structures disposed over the substrate, a plurality of adjacent overhang structures disposed over an upper surface of the first PDL structure, and a plurality of sub-pixels. Each of the overhang structures includes a second PDL structure disposed over an upper surface of the first PDL structures, the second PDL structure including a non-conductive material, a body structure disposed over top of the second PDL structure, the body structure including a conductive material, and a top structure disposed over the body structure, the top structure including a top extension extending laterally past the body structure. The plurality of sub-pixels each include an anode, a hole-injection layer (HIL) material disposed over and in contact with the anode, an additional organic light emitting diode (OLED) material disposed over the HIL material, and a cathode disposed over the additional OLED material. The HIL material extends under the top extension and contacts the non-conducting material of the second PDL structure. The cathode extends under the adjacent overhang structures.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 1C is a schematic, top sectional view of a sub-pixel circuit having a dot-type architecture according to embodiments.

FIG. 1D is a schematic, cross-sectional view of a sub-pixel circuit having a line-type architecture according to embodiments.

FIG. 6A-6F are schematic, cross-sectional views of a substrate during a method for forming a sub-pixel circuit according to embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
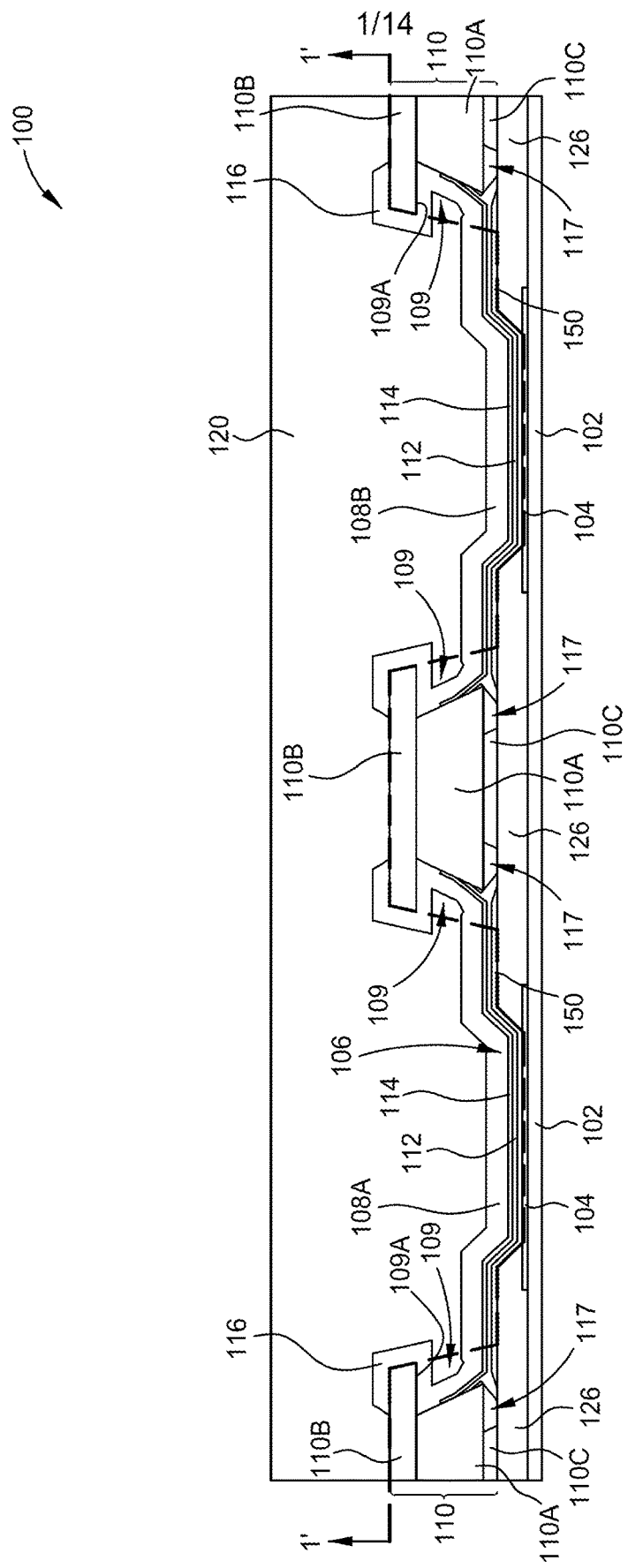
FIG. 1A is a schematic, cross-sectional view of a sub-pixel circuit according to embodiments.

Embodiments described herein generally relate to a display. More specifically, embodiments described herein relate to sub-pixel circuits and methods of forming sub-pixel circuits that may be utilized in a display such as an organic light-emitting diode (OLED) display. In various embodiments, the sub-pixels employ advanced overhang structures to improve functionality of the display.

In one embodiment, a device includes a substrate and a plurality of adjacent pixel-defining layer (PDL) structures disposed over the substrate. Each PDL structure includes an upper surface and a plurality of sub-pixels. Each sub-pixel includes adjacent first overhangs, each first overhang defined by a body extension of a body structure extending laterally past a base structure. The base structure is disposed over the upper surface of the PDL structure while the body structure is disposed over the base structure. The body structure is composed of conductive material while the base structure is composed of a metal-containing or inorganic material. Adjacent second overhangs are defined by a top extension of a top structure extending laterally past an overhang portion of the body extension. The top structure is composed of an inorganic material and is disposed over the body structure. The sub-pixel further includes an anode and a hole injection layer (HIL) material disposed over and in contact with the anode. The HIL material is disposed under the adjacent first overhangs. Further, an additional organic light emitting diode (OLED) material is disposed over the HIL material and extends under the adjacent first overhangs. The additional OLED material is disposed over a first portion of the body extension, and a cathode is disposed over the additional OLED material. The cathode extends under the adjacent second overhangs and contacts a second portion of the body extension.

In another embodiment, a device has a plurality of sub-pixels, each sub-pixel includes a section of a substrate and at least one metal-containing layer disposed over the substrate. Adjacent first overhangs are each defined by a pixel-defining layer (PDL) extension of a PDL structure extending laterally past a base structure. The base structure is disposed over an upper surface of the at least one metal-containing layer. The base structure is composed of a metal-containing material or an inorganic material. The PDL extension is disposed over the base structure and a PDL body of the PDL structure is disposed over the substrate. A body structure is disposed over the upper surface of the PDL structure. Adjacent second overhangs are each defined by a top extension of a top structure extending laterally past an overhang portion of a body extension of a body structure. The top structure is disposed over the body structure, and the body structure is disposed over the PDL structure. The top structure is composed of an inorganic material while the body structure is composed of a conductive material. A hole injection layer (HIL) material is disposed over and in contact with the at least one metal-containing layer and disposed under the adjacent first overhangs. An additional organic light emitting diode (OLED) material is disposed over the HIL material and extends under the adjacent first overhangs. The additional OLED material is disposed over a first portion of the body extension structure. A cathode is disposed over the additional OLED material and extends under the adjacent second overhangs, contacting a second portion of the body extension structure.

In another embodiment, a device includes a substrate and a plurality of adjacent pixel-defining layer (PDL) structures disposed over the substrate. A plurality of adjacent overhang structures are disposed over an upper surface of the PDL structures. Each of the overhang structures includes a base structure disposed over an upper surface of the PDL structures, a body structure disposed over the base structure, and a top structure disposed over the body structure. The base structure includes a non-conductive material. The body structure includes a conductive material. The top structure includes a top extension extending laterally past the base structure. The device further includes a plurality of sub-pixels, each subpixel including an anode, a hole injection layer (HIL) material disposed over and in contact with the anode, an additional organic light emitting diode (OLED) material disposed over the HIL material, and a cathode disposed over the additional OLED material. The HIL material extends under the top extension and contacts a first portion of the non-conductive material of the base structure. The cathode is disposed over the additional OLED material and extends under the adjacent overhangs. The cathode contacts the conductive material at a sidewall of the body structure.

In yet another embodiment, a device includes a substrate, a plurality of first adjacent pixel-defining layer (PDL) structures disposed over the substrate, a plurality of adjacent overhang structures disposed over an upper surface of the first PDL structure, and a plurality of sub-pixels. Each of the overhang structures includes a second PDL structure disposed over an upper surface of the first PDL structures. The second PDL structure include a non-conductive material. A body structure is disposed over the top of the second PDL structure, the body structure including a conductive material. A top structure is disposed over the body structure, the top structure including a top extension extending laterally past the body structure. The plurality of sub-pixels each include an anode, a hole-injection layer (HIL) material disposed over and in contact with the anode, an additional organic light emitting diode (OLED) material disposed over the HIL material, and a cathode disposed over the additional OLED material. The HIL material extends under the top extension and contacts the non-conducting material of the second PDL structure. The cathode extends under the adjacent overhang structures.

Each of the embodiments described herein of the sub-pixel circuit include a plurality of sub-pixels with each of the sub-pixels defined by adjacent overhang structures that are permanent to the sub-pixel circuit. While the Figures depict two sub-pixels with each sub-pixel defined by adjacent overhang structures, the sub-pixel circuit of the embodiments described herein include a plurality of sub-pixels, such as two or more sub-pixels. Each sub-pixel has OLED materials configured to emit a white, red, green, blue or other color light when energized. E.g., the OLED materials of a first sub-pixel emits a red light when energized, the OLED materials of a second sub-pixel emits a green light when energized, and the OLED materials of a third sub-pixel emits a blue light when energized.

The overhangs are permanent to the sub-pixel circuit and include at least a top structure disposed over a body structure. The adjacent overhang structures defining each sub-pixel of the sub-pixel circuit of the display provide for formation of the sub-pixel circuit using evaporation deposition and provide for the overhang structures to remain in place after the sub-pixel circuit is formed. Evaporation deposition is utilized for deposition of OLED materials (including a hole injection layer (HIL), a hole transport layer (HTL), an emissive layer (EML), and an electron transport layer (ETL)) and cathode. In one embodiment, the HIL layer has a greater conductivity than the HTL layer. In another embodiment, the HIL layer has a greater energy level than the HTL layer. In some instances, an encapsulation layer may be disposed via evaporation deposition. In embodiments including one or more capping layers, the capping layers are disposed between the cathode and the encapsulation layer. The overhang structures and the evaporation angle set by the evaporation source define the deposition angles, i.e., the overhang structures provide for a shadowing effect during evaporation deposition with the evaporation angle set by the evaporation source. In order to deposit at a particular angle, the evaporation source is configured to emit the deposition material at a particular angle with regard to the overhang structure. The encapsulation layer of a respective sub-pixel is disposed over the cathode with the encapsulation layer extending under at least a portion of each of the adjacent overhang structures and along a sidewall of each of the adjacent overhang structures.

FIG. 1A is a schematic, cross-sectional view of a sub-pixel circuit 100 according to embodiments. The cross-sectional view of FIG. 1A is taken along section line 1"-1" of FIGS. 1C and 1D. The sub-pixel circuit 100 includes a substrate 102. Metal-containing layers 104 may be patterned on the substrate 102 and are defined by adjacent pixel-defining layer (PDL) structures 126 disposed over the substrate 102. In one embodiment, the PDL structures 126 are disposed on the substrate 102. In one embodiment, the metal-containing layers 104 are pre-patterned on the substrate 102. E.g., the substrate 102 is pre-patterned with metal-containing layers 104 of indium tin oxide (ITO). The metal-containing layers 104 are configured to operate as anodes of respective sub-pixels. In one embodiment, the metal-containing layer 104 is a layer stack of a first transparent conductive oxide (TCO) layer, a second metal-containing layer disposed on the first TCO layer, and a third TCO layer disposed on the second metal-containing layer. The metal-containing layers 104 include, but are not limited to, chromium, titanium, gold, silver, copper, aluminum, ITO, a combination thereof, or other suitably conductive materials.

The plurality of PDL structures 126 are disposed over the substrate 102. The PDL structures 126 include one of an organic material, an organic material with an inorganic coating disposed thereover, or an inorganic material. The organic material of the PDL structures 126 includes, but is not limited to, polyimides. The inorganic material of the PDL structures 126 includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent PDL structures 126 define a respective sub-pixel and expose the anode (i.e., metal-containing layer 104) of the respective sub-pixel circuit 100.

The sub-pixel circuit 100 has a plurality of sub-pixels 106 including at least a first sub-pixel 108A and a second sub-pixel 108B. While the Figures depict the first sub-pixel 108A and the second sub-pixel 108B, the sub-pixel circuit 100 of the embodiments described herein may include two or more sub-pixels 106, such as a third and a fourth sub-pixel. Each sub-pixel 106 has OLED materials configured to emit a white, red, green, blue or other color light when energized. E.g., the OLED materials of the first sub-pixel 108A emits a red light when energized, the OLED materials of the second sub-pixel 108B emits a green light when energized, the OLED materials of a third sub-pixel emits a blue light when energized, and the OLED materials of a fourth sub-pixel emits another color light when energized.

Figure 1B:
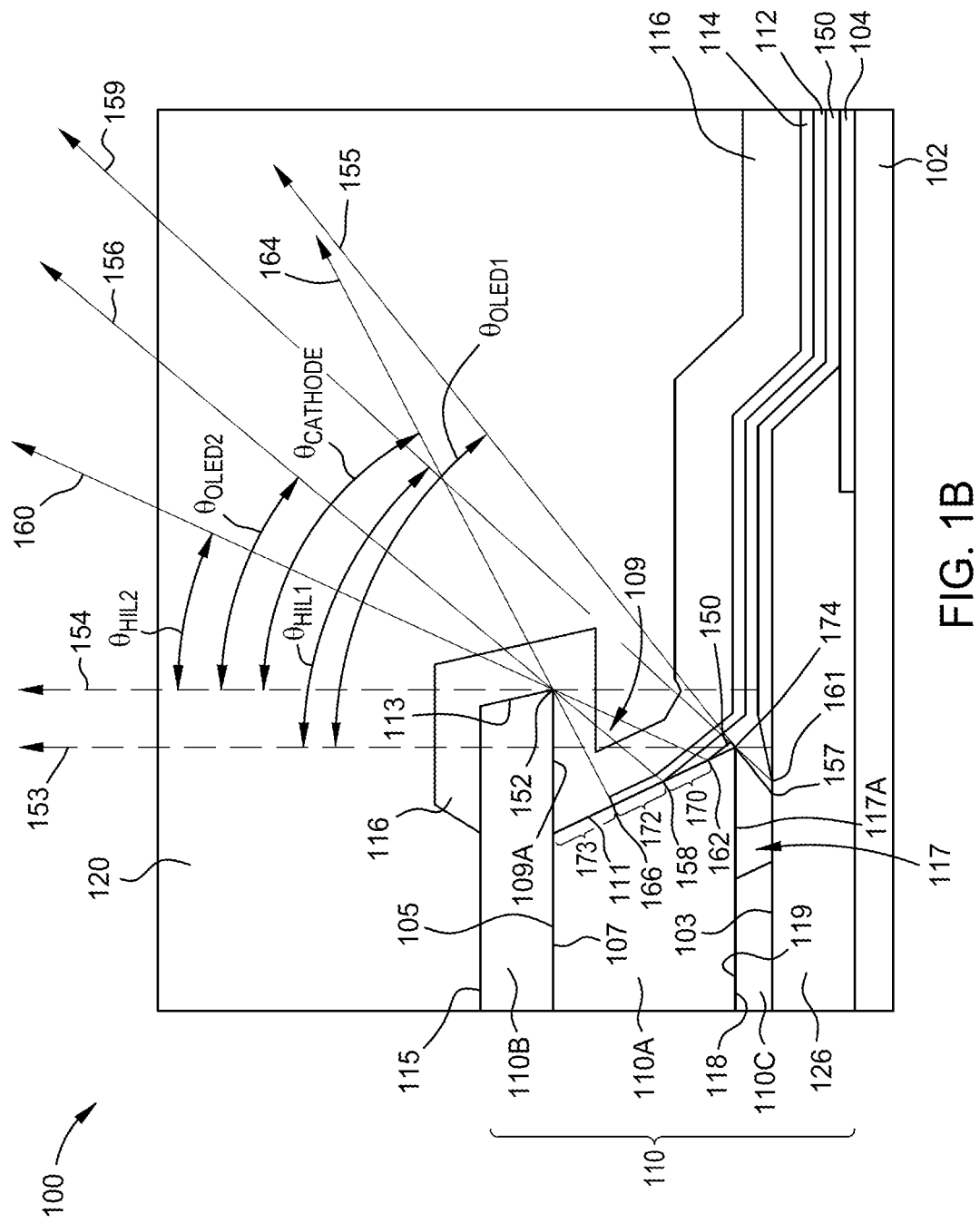
FIG. 1B is a schematic, cross-sectional view of an overhang structure of a sub-pixel circuit according embodiments.

Each sub-pixel 106 includes an overhang structure 110. The overhang structures 110 are permanent to the sub-pixel circuit. The overhang structures 110 further define each sub-pixel 106 of the sub-pixel circuit 100. Each overhang structure 110 includes adjacent first overhangs 117 and adjacent second overhangs 109. The adjacent first overhangs are defined by a body extension 117A (as shown in FIG. 1B) of a body structure 110A extending laterally past a base structure 110C. The base structure 110C is disposed over an upper surface 103 (as shown in FIG. 1B) of the plurality of adjacent PDL structures 126. The body structure 110A is disposed over the top surface 119 of the base structure 110C. The adjacent second overhangs 109 are defined by a top extension 109A (as shown in FIG. 1B) of a top structure 110B extending laterally past an overhang portion of the body extension 117A. The top structure 110B is disposed over the body structure 110A. In one embodiment, the top structure 110B is disposed on the body structure 110A.

In one embodiment, the overhang structures 110 includes the top structure 110B of a non-conductive inorganic material and the body structure 110A of a conductive inorganic material. In another embodiment, the overhang structures 110 includes the top structure 110B of a conductive inorganic material and the body structure 110A of a conductive inorganic material. The conductive materials of the body structure 110A include aluminum (Al), aluminum neodymium (AlNd), molybdenum (Mo), molybdenum tungsten (MoW), copper (Cu), or combinations thereof. The inorganic materials of the top structure include titanium (Ti), silicon nitride ($Si_3N_4$), silicon oxide ($SiO_2$), silicon oxynitride ($Si_2N_2O$), or combinations thereof. The base structure 110C includes a metal-containing material or an inorganic material. In one example, the metal-containing material is a transparent conductive oxide (TCO) material. The TCO material includes, but is not limited to, indium zinc oxide (IZO), indium tin oxide (ITO), indium gallium zinc oxide (IGZO), or combinations thereof. The overhang structures 110 are able to remain in place, i.e., are permanent.

Adjacent first overhangs 117 are defined by a body extension 117A. At least a bottom surface 118 of the body structure 110A is wider than a top surface 119 of a base structure 110C to form the body extension 117A (as shown in FIG. 1B). The body extension 117A of the body structure 110A forms the first overhang 117 and allows for the body structure 110A to shadow the base structure 110C. The shadowing of the first overhang 117 provides for evaporation deposition of OLED materials. The OLED materials may include one or more of a HIL, a HTL, an EML, and an ETL. A HIL material 150 of the OLED materials is disposed over and in contact with the metal-containing layer 104. The HIL material 150 is disposed under adjacent first overhang 117. In one embodiment, the HIL material 150 is different from the material of the body structure 110A, the top structure 110B, and base structure 110C. An additional OLED material 112 is disposed over the HIL material 150 and extends past an endpoint of the HIL material 150 to contact the PDL structure 126 under the adjacent first overhang 117. In one embodiment, the additional OLED material is disposed on the HIL material 150. In one embodiment, the additional OLED material 112 is different from the material of the body structure 110A, the body structure 110B, and the base structure 110C. The overhang structures 110 and an evaporation angle set by an evaporation source define deposition angles, i.e., the overhang structures provide for a shadowing effect during evaporation deposition with the evaporation angle set by the evaporation source. The first overhang 117 and the evaporation source define a first HIL angle $\theta_{HIL1}$ of the HIL material 150 and a first OLED angle $\theta_{OLED1}$ of the additional OLED material 112. The first HIL angle $\theta_{HIL1}$ of the HIL material 150 and first OLED angle $\theta_{OLED1}$ of the additional OLED material 112 result from the overhang structures and evaporation deposition of the HIL material 150 and the additional OLED material 112.

Adjacent second overhangs 109 are defined by a top extension 109A of the top structure 110B. At least a bottom surface 107 of the top structure 110B is wider than a top surface 105 of the body structure 110A to form the top extension 109A (as shown in FIG. 1B) of the second overhang 109. The top structure 110B is disposed over a top surface 105 of the body structure 110A. The top extension 109A of the top structure 110B forms the second overhang 109 and allows for the top structure 110B to shadow the body structure 110A. The shadowing of the second overhang 109 provides for evaporation deposition of each of the HIL material 150, the additional OLED material 112, and a cathode 114. Each of the HIL material 150 and the additional OLED material 112 are disposed under the second overhang 109. The additional OLED material 112 is further disposed over a first portion 170 of a sidewall 111 of a body extension 117A of the body structure 110A. The cathode 114 is disposed over the additional OLED material 112 and extends under the adjacent second overhang 109. The cathode contacts a second portion 172 of a sidewall 111 of the body extension 117A. The overhang structures 110 and an evaporation angle set by an evaporation source define deposition angles, i.e., the overhang structures provide for a shadowing effect during evaporation deposition with the evaporation angle set by the evaporation source. The second overhang 109 and the evaporation source define a second HIL angle $\theta_{HIL2}$ of the HIL material 150, a second OLED angle $\theta_{OLED2}$ of the additional OLED material 112 and a cathode angle $\theta_{cathode}$ of the cathode 114. The first HIL angle $\theta_{HIL2}$ of the HIL material 150, second OLED angle $\theta_{OLED2}$ of the additional OLED material 112 and the cathode angle $\theta_{cathode}$ of the cathode 114 result from the overhang structures and the evaporation angle set by the evaporation source, i.e., the overhang structures provide for a shadowing effect during evaporation deposition of the HIL material 150, the additional OLED material 112, and the cathode 114, with the evaporation angle set by the evaporation source. In one embodiment, the additional OLED material 112 and the cathode 114 contact the body extension 117A of the body structure 110A of the overhang structures 110. The HIL material 150 does not contact the sidewall 111 of the body extension 117A of the body structure 110A.

Figure 4A:
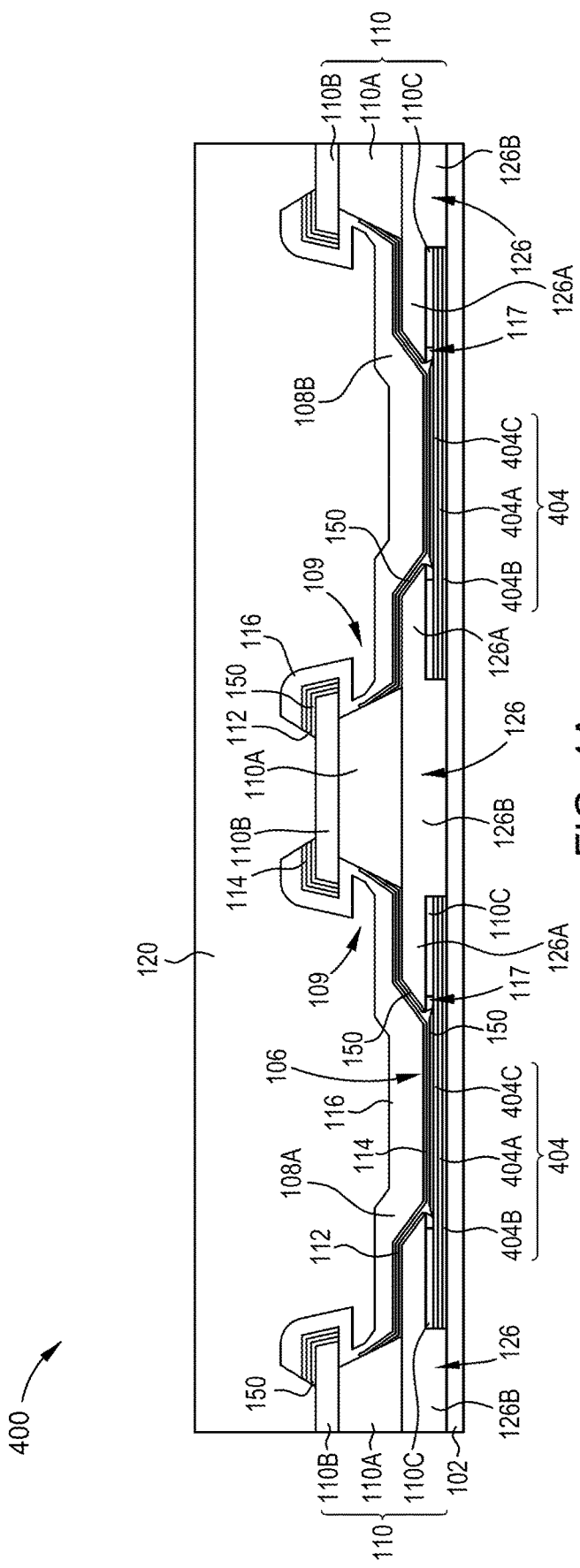
FIG. 4A is a schematic, cross-sectional view of a sub-pixel circuit according to embodiments.
Figure 4B:
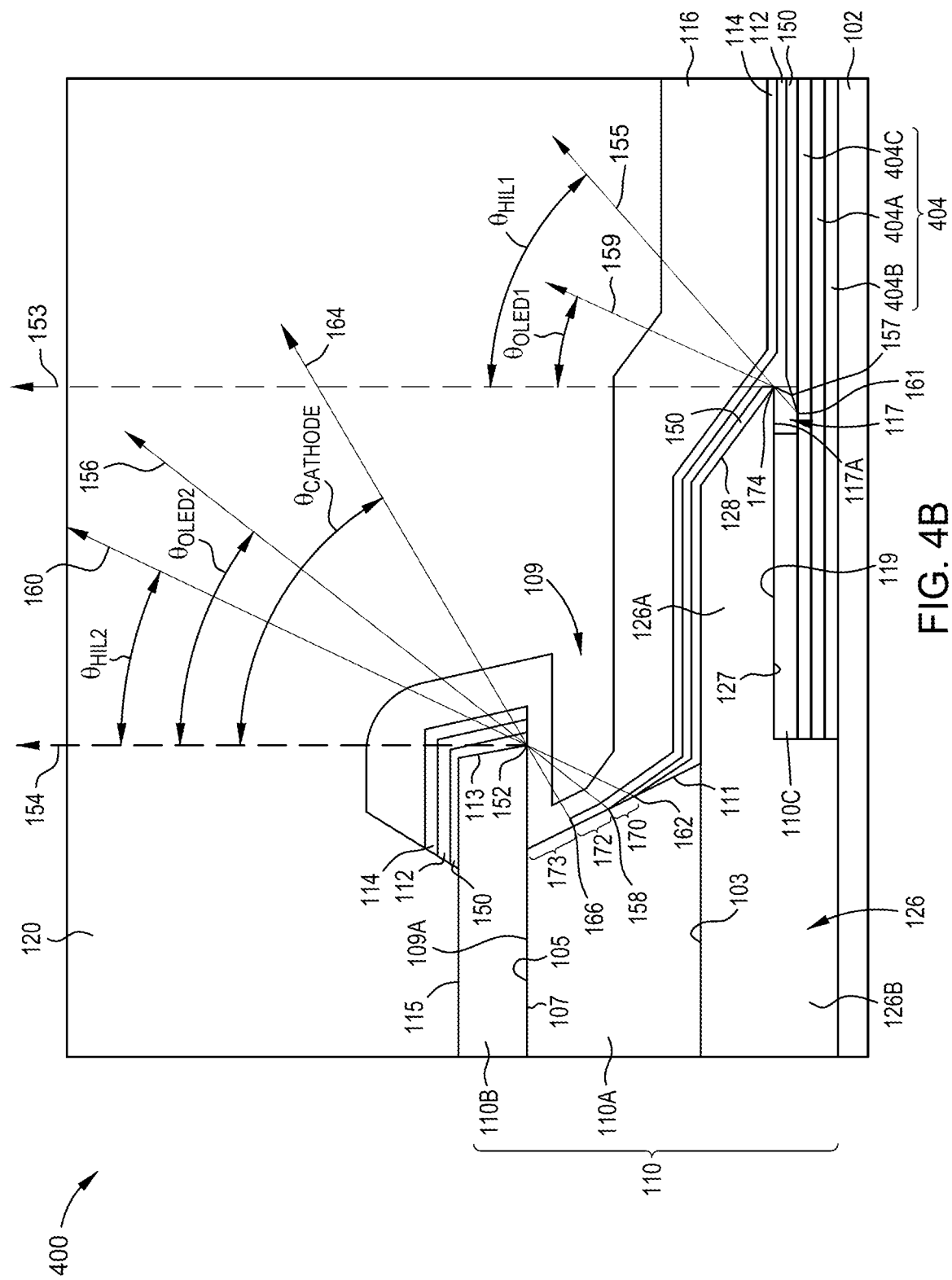
FIG. 4B is a schematic, cross-sectional view of an overhang structure of a sub-pixel circuit according to embodiments.

In one embodiment, the HIL material 150 is disposed over and in contact with the metal-containing layers 104 and the upper surface 103 of the PDL structure 126. The HIL material 150 is disposed under the adjacent first and second overhangs 117, such that the HIL material 150 contacts the body extension 117A. The additional OLED material 112 is disposed over the HIL material 150. In one embodiment, the additional OLED material is disposed on the HIL material 150. The additional OLED material extends under the adjacent first overhang 117 and is disposed over a first portion of the body extension 117A. In the illustrated embodiment of FIGS. 1A and 1B, the additional OLED material 112 extends to contact the PDL structure 126 at a first OLED endpoint 157 past a first HIL endpoint 161 of the HIL material 150 under the adjacent overhang 117. In another embodiment, e.g., as shown in FIGS. 4A and 4B as applied to the sub-pixel circuit 100, the HIL material 150 extends under the adjacent overhang 117 past a first OLED endpoint 157. A portion of the additional OLED material 112 is disposed under the adjacent first overhang 117 and separates the HIL material 150 disposed on the metal-containing layer 104 and the HIL material 150 disposed on the body extension 117A.

The cathode 114 includes a conductive material, such as a metal. E.g., the cathode 114 includes, but is not limited to, silver, magnesium, chromium, titanium, aluminum, ITO, or a combination thereof. In one embodiment, material of the cathode 114 is different from the material of the body structure 110A, the top structure 110B, and base structure 110C. In some embodiments, e.g., as shown in FIGS. 4A and 4B as applied to the sub-pixel circuit 100, the HIL material 150, the additional OLED material 112 and the cathode 114 are disposed over a sidewall 113 of the top structure 110B of the overhang structures 110. In other embodiments, the HIL material 150, e.g., as shown in FIGS. 4A and 4B as applied to the sub-pixel circuit 100, the additional OLED material 112, and the cathode 114 are disposed over a top surface 115 of the top structure 110B of the overhang structures 110. In the illustrated embodiments shown in FIGS. 1A and 1B, the HIL material 150, the additional OLED material 112, and the cathode 114 end on the sidewall 111 of the body structure 110A, i.e., are not disposed over the sidewall 113 of the top structure 110B or the top surface 115 of the top structure 110B.

Figure 8A:
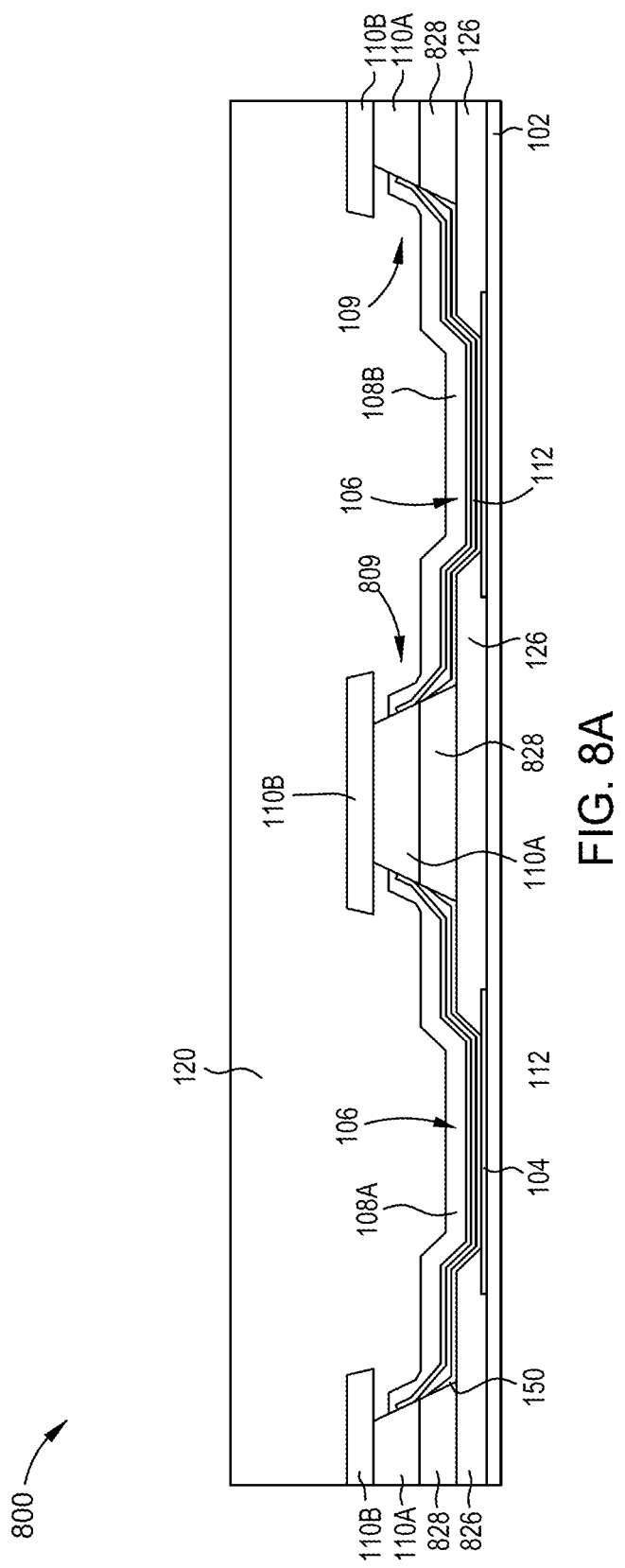
FIG. 8A is a schematic, cross-sectional view of a sub-pixel circuit according to embodiments.
Figure 8B:
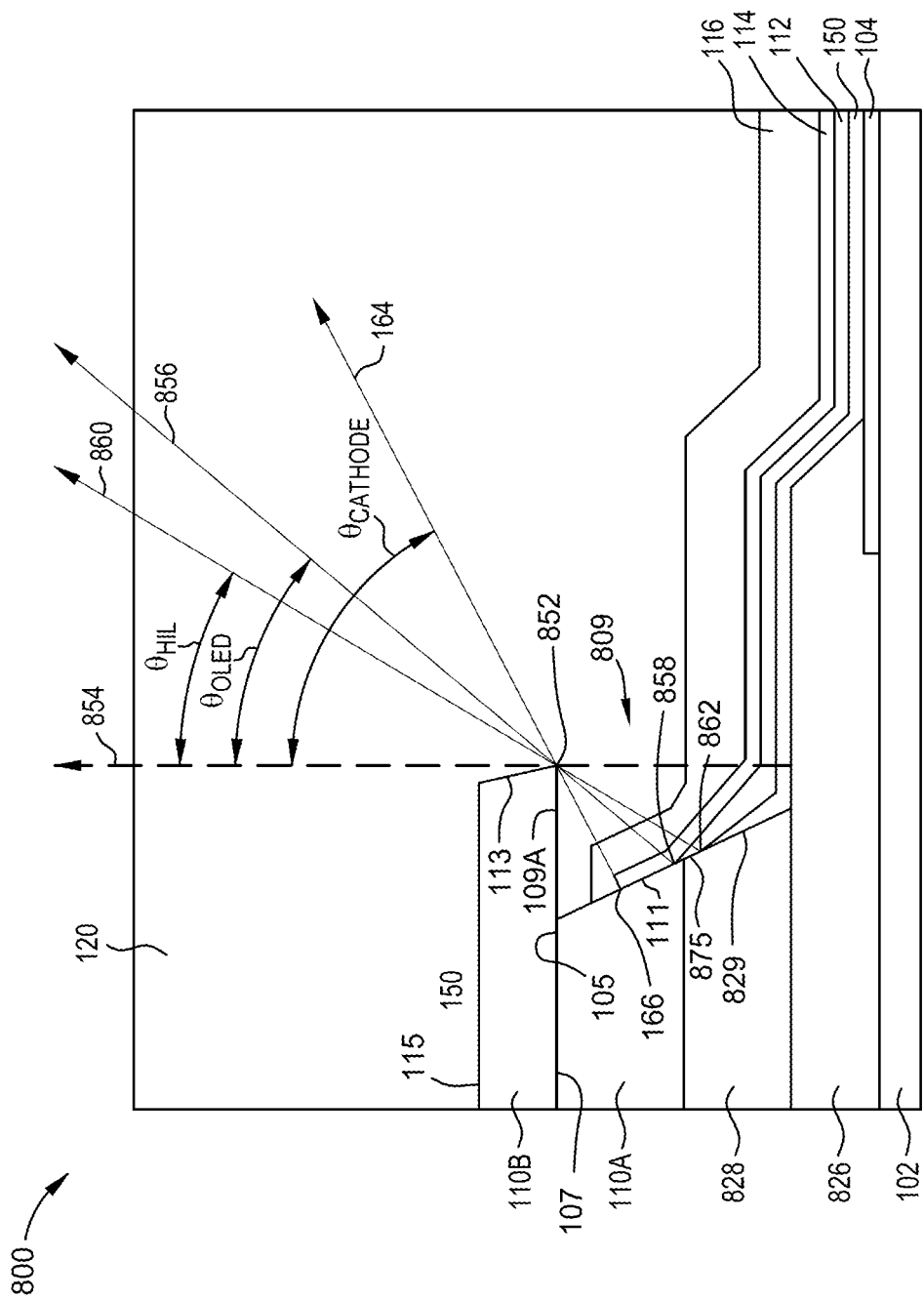
FIG. 8B is a schematic, cross-sectional view of an overhang structure of a sub-pixel circuit according to embodiments.

Each sub-pixel 106 includes an encapsulation layer 116. The encapsulation layer 116 may be or may correspond to a local passivation layer. The encapsulation layer 116 of a respective sub-pixel is disposed over the cathode 114 (and additional OLED material 112) with the encapsulation layer 116 extending under at least a portion of each of the second overhangs 109 and along a sidewall of each of the body structure 110A and the top structure 110B. The encapsulation layer 116 is disposed over the cathode 114 and extends at least to contact the cathode 114 over the second portion 172 of the sidewall 111 of the body extension 117A. In some embodiments, the encapsulation layer 116 extends to contact the conductive material of the body structure 110A at a third portion 173 of the sidewall 111 of the body extension 117A. In the illustrated embodiments as shown in FIGS. 1A and 1B, the encapsulation layer 116 extends to contact an inorganic material of the top structure 110B at an underside surface of the top extension 109A, the sidewall 113 of the top structure 110B, and the top surface 115 of the top structure 110B. In some embodiments, e.g., as shown in FIGS. 4A and 4B as applied to the sub-pixel circuit 100, the encapsulation layer 116 extends to contact an inorganic material of the top structure 110B at an underside surface of the top extension 109A and to be disposed over the HIL material 150, the additional OLED material 112, and the cathode 114 when the HIL material 150, the additional OLED material 112, and the cathode 114 are disposed over the sidewall 113 and top surface 115 of the top structure 110B. In some embodiments, e.g., as shown in FIGS. 8A and 8B as applied to the sub-pixel circuit 100, the encapsulation layer 116 ends at the sidewall 111 of the body structure 110A, i.e., is not disposed over the sidewall 113 of the top structure 110B, the top surface 115 of the top structure 110B, or the underside surface of the top extension 109A of the overhang structures 110. The encapsulation layer 116 includes the non-conductive inorganic material, such as the silicon-containing material. The silicon-containing material may include $Si_3N_4$ containing materials.

In embodiments including one or more capping layers, the capping layers are disposed between the cathode 114 and the encapsulation layer 116. E.g., a first capping layer and a second capping layer are disposed between the cathode 114 and the encapsulation layer 116. Each of the embodiments described herein may include one or more capping layers disposed between the cathode 114 and the encapsulation layer 116. The first capping layer may include an organic material. The second capping layer may include an inorganic material, such as lithium fluoride. The first capping layer and the second capping layer may be deposited by evaporation deposition. In another embodiment, the sub-pixel circuit 100 further includes at least a global passivation layer 120 disposed over the overhang structure 110 and the encapsulation layer 116. In yet another embodiment, the sub-pixel includes an intermediate passivation layer disposed over the overhang structures 110 of each of the sub-pixels 106, and disposed between the encapsulation layer 116 and the global passivation layer 120.

FIG. 1B is a schematic, cross-sectional view of an overhang structure 110 of a sub-pixel circuit 100 according to embodiments. The body extension 117A includes a first underside edge 174 and a first overhang vector 153. The top structure 110B includes a second underside edge 152 and a second overhang vector 154. The first underside edge 174 extends past a first HIL endpoint 161. The first overhang vector 153 is defined by the first underside edge 174 and the PDL structure 126. The HIL material 150 is disposed over the metal-containing layer 104 and over a portion of the PDL structure 126, extending under the first overhang 117 to the first HIL endpoint 161. The additional OLED material 112 is disposed over the HIL material 150 and extends to contact the PDL structure 126 past the first HIL endpoint 161 of the HIL material 150 to a first OLED endpoint 157 under the first overhang 117.

In one embodiment, the second underside edge 152 extends past the first underside edge 174. In another embodiment, the first underside edge 174 extends past the second underside edge 152. The second overhang vector 154 is defined by the second underside edge 152 and the PDL structure 126. In one embodiment, the HIL material 150 is not disposed on the conductive material of the body structure 110A. In another embodiment, the HIL material 150 is also disposed over a portion of the sidewall 111 of the body extension 117A under the second overhang 109, extending to a second HIL endpoint 162. The additional OLED material 112 is disposed over the HIL material 150 and extends to a second OLED endpoint 158. The additional OLED material 112 contacts the first portion 170 of the sidewall 111 of the body extension 117A. The additional OLED material 112 separates the HIL material 150 disposed on the body extension 117A from the HIL material 150 disposed on the PDL structure 126. This creates a discontinuation between the HIL material 150 disposed on the metal-containing layer 104 and the HIL material 150 on the sidewall 111 of the body extension 117A. The discontinuation breaks a direct path through the HIL material 150 from the metal-containing layer 104 to the conductive material of the body structure 110A. Therefore, the HIL material 150 does not continuously connect the conductive material of the body structure 110A to the metal-containing layer 104. Thus, when the input current flows to the metal-containing layer 104 and subsequently to the HIL material 150, the current flows through the additional OLED material 112 to the cathode 114 and illuminates the sub-pixels 106. If the HIL material 150 continuously connected the conductive material of the body structure 110A to the metal-containing layer 104, a portion of the current would flow from the HIL material 150 to the body structure 110A and would bypass the additional OLED material 112.

The HIL material 150 forms a first HIL angle $\theta_{HIL1}$ between a first HIL vector 159 and a first overhang vector 153. The first HIL vector 159 is defined by the first HIL endpoint 161 extending under the first overhang 117, the first underside edge 174 of the body extension 117A, and the angle set by the evaporation source. An additional OLED material 112 is disposed over the HIL material 150 and forms a first OLED angle $\theta_{OLED1}$ between a first OLED vector 155 and the first overhang vector 153. The first OLED vector 155 is defined by a first OLED endpoint 157 extending under the body structure 110A, the first underside edge 174 of the body structure 110A, and the angle set by the evaporation source.

The HIL material 150 forms a second HIL angle $\theta_{HIL2}$ between a second HIL vector 160 and a second overhang vector 154. The second HIL vector 160 is defined by a second HIL endpoint 162 extending under the second overhang 109, the second underside edge 152 of the top extension 109A, and the angle set by the evaporation source. An additional OLED material 112 is disposed over the HIL material 150 and forms a second OLED angle $\theta_{OLED2}$ between a second OLED vector 156 and the second overhang vector 154. The second OLED vector 156 is defined by a second OLED endpoint 158 extending under the top structure 110b, the second underside edge 152 of the top extension 109A, and the angle set by the evaporation source. The additional OLED material 112 is disposed over a first portion 170 of the sidewall 111 of the body extension 117A.

The cathode 114 is disposed over the additional OLED material 112 at the first portion 170 of the sidewall 111 of the body extension 117A and over the PDL structure 126. In some embodiments, the cathode 114 is disposed on a second portion 172 of the sidewall 111 of the body extension 117A. The cathode 114 forms a cathode angle $\theta_{cathode}$ between a cathode vector 164 and the second overhang vector 154. The cathode vector 164 is defined by a cathode edge 166 at least extending under the top structure 110b, the second underside edge 152 of the top extension 109A, and the angle set by the evaporation source. The encapsulation layer 116 is disposed over the cathode 114 (and additional OLED material 112) with the encapsulation layer 116 extending at least under the top structure 110b of the overhang structure 110 and contacting a third portion 173 of the sidewall 111 of the body extension 117A.

During evaporation deposition of the additional OLED material 112, the first and second underside edges 174, 152 define the position of the first and second OLED endpoints 157, 158. E.g., the additional OLED material 112 is evaporated at an OLED maximum angle that corresponds to the first and second OLED vectors 155, 156 and the first and second underside edges 174, 152 ensure that the additional OLED material 112 is not deposited past the first and second OLED endpoints 157, 158. During evaporation of the HIL material 150, the first and second underside edges 174, 152 define the position of the first and second HIL endpoints 161, 162. E.g., the HIL material 150 is evaporated at an HIL maximum angle that corresponds to the first and second HIL vectors 159, 160 and the first and second underside edges 174, 152 ensure that the HIL material 150 is not deposited past the first and second HIL endpoints 161, 162. In one embodiment, the second HIL endpoint 162 is on the sidewall 111 of the body extension 117A, allowing for the deposition of the HIL material 150 on the body extension 117A. The first HIL endpoint 161 is on the PDL structure 126. In another embodiment, there is no second HIL endpoint 162 and the first HIL endpoint 161 is on the PDL structure 126. No HIL material 150 is deposited on the body extension 117A. During evaporation deposition of the cathode 114, the second underside edge 152 of the top extension 109A defines the position of the cathode edge 166. E.g., the cathode 114 is evaporated at a cathode maximum angle that corresponds to the cathode vector 164 and the second underside edge 152 ensures that the cathode 114 is not deposited past the cathode edge 166. The second OLED angle $\theta_{OLED2}$ is less than the cathode angle $\theta_{cathode}$. In one embodiment, the first and second HIL angles $\theta_{HIL1}$ and $\theta_{HIL2}$ are less than the first and second OLED angles $\theta_{OLED}$ and $\theta_{OLED2}$, respectively. In another embodiment, the first and second OLED angles $\theta_{OLED}$ and $\theta_{OLED2}$ are less than the first and second HIL angles $\theta_{HIL1}$ and $\theta_{HIL2}$.

FIG. 1C is a schematic, top sectional view of a sub-pixel circuit 100 having a dot-type architecture 101C according to embodiments. FIG. 1D is a schematic, cross-sectional view of a sub-pixel circuit 100 having a line-type architecture 101D according to embodiments. Each of the top sectional views of FIGS. 1C and 1D are taken along section line 1'-1' of FIG. 1A. The dot-type architecture 101C includes a plurality of pixel openings 124A from adjacent PDL structures 126. Each of pixel opening 124A is surrounded by overhang structures 110, as shown in FIG. 1A, that defines each of the sub-pixels 106 of the dot-type architecture 101C. The line-type architecture 101D includes a plurality of pixel openings 124B from adjacent PDL structures 126. Each of pixel opening 124B is abutted by overhang structures 110, as shown in FIG. 1A, that define each of the sub-pixels 106 of the line-type architecture 101D.

Figure 2:
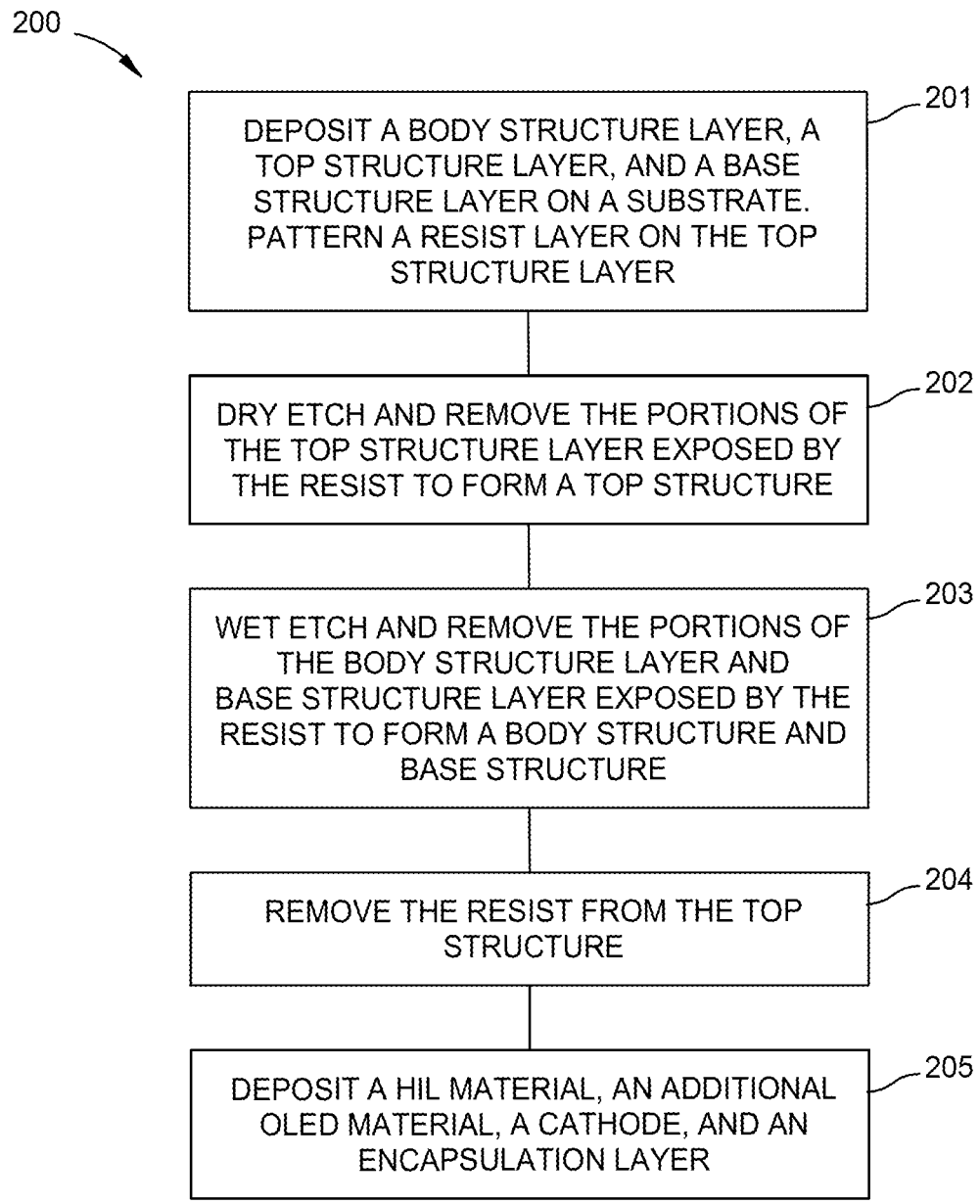
FIG. 2 is a flow diagram of a method for forming a sub-pixel according to according to embodiments.

FIG. 2 is a flow diagram of a method 200 for forming a sub-pixel circuit 100 according to embodiments. FIGS. 3A-3D are schematic, cross-sectional views of a substrate 102 during the method 200 for forming the sub-pixel circuit 100 according embodiments described herein.

Figure 3A:
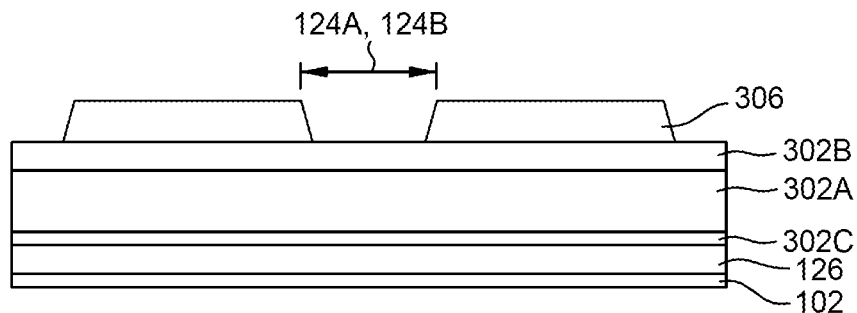
FIG. 3A-3D are schematic, cross-sectional views of a substrate during a method of forming a sub-pixel according to embodiments.

At operation 201, as shown in FIG. 3A, a base structure layer 302C, a body structure layer 302A, and a top structure layer 302B are deposited over the substrate 102. The base structure layer 302C is disposed over the PDL structures 126. The body structure layer 302A is disposed over the base structure layer 302C. The top structure layer 302B is disposed over the body structure layer 302A. The body structure layer 302A corresponds to the body structure 110A of the overhang structures 110. The top structure layer 302B corresponds to the top structure 110b of the overhang structures 110. The base structure layer 302C corresponds to the base structure 110C of the overhang structures 110. A resist 306 is disposed and patterned. The resist 306 is disposed over the top structure layer 302B. The resist 306 is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the resist 306 determines whether the resist is a positive resist or a negative resist. The portion of the top structure layer 302B that has the resist 306 is patterned to form one of a pixel opening 124A of the dot-type architecture 101C or a pixel opening 124B of the line-type architecture 101D of a first sub-pixel 108a. The patterning is one of a photolithography, digital lithography process, or laser ablation process.

Figure 3B:
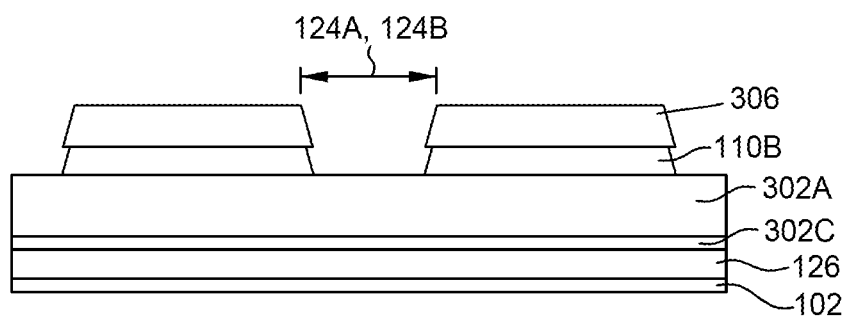

At operation 202, as shown in FIG. 3B, portions of the top structure layer 302B exposed by the pixel opening 124A, 124B are removed. The top structure layer 302B exposed by the pixel opening 124A, 124B may be removed by a dry etch process. Operation 202 forms the top structure 110B.

Figure 3C:
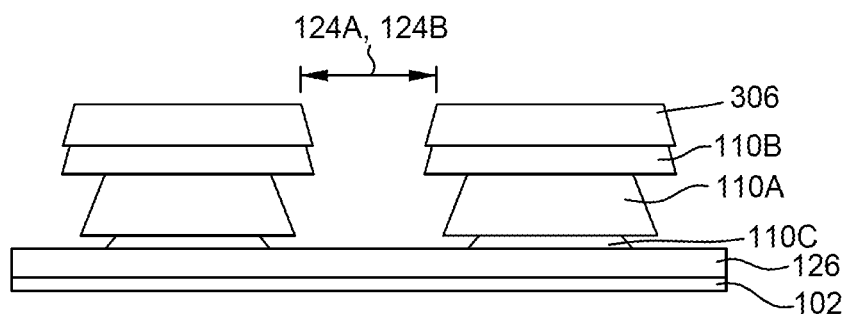

At operation 203, as shown in FIG. 3C, portions of the body structure layer 302A and the base structure layer 302C exposed by the pixel opening 124A, 124B are removed. The body structure layer 302A and the base structure layer 302C exposed by the pixel opening 124A, 124B may be removed by a wet etch process. Operation 203 forms the rest of the overhang structures 110 of the first sub-pixel 108A. The etch selectivity between the materials of the top structure layer 302B corresponding to the top structure 110B, the body structure layer 302A corresponding to the body structure 110A, and the etch processes to remove the exposed portions of the top structure layer 302B, the body structure layer 302A provide for the bottom surface 107 of the top structure 110B being wider than the top surface 105 of the body structure 110A to form a top extension 109A of the second overhang 109 (as shown in FIGS. 1A and 1B). The etch selectivity between the materials of the body structure layer 302A corresponding to the body structure 110A, the base structure layer 302C corresponding to the base structure 110C and the etch processes to remove the exposed portions of the body structure layer 302A and the base structure layer 302C provide for the bottom surface 118 of the body structure 110A being wider than the top surface 119 of the base structure 110C to form a body extension 117A of the first overhang 117 (as shown in FIGS. 1A and 1B). The shadowing of the first and second overhang 109, 117 provide for evaporation deposition the HIL material 150, the additional OLED material 112 and the cathode 114.

Figure 3D:
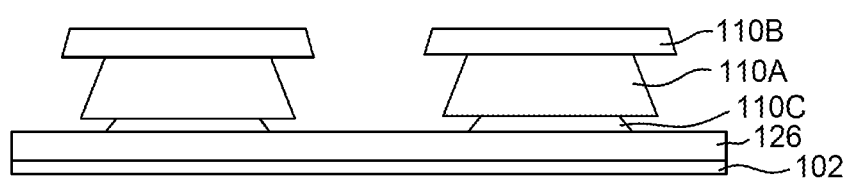

At operation 204, as shown in FIG. 3D the resist 306 is removed from the top structure 110B, leaving behind the overhang structures 110.

At operation 205, the OLED material of the first sub-pixel 108A, the cathode 114, and the encapsulation layer 116 are deposited. The OLED materials includes an HIL material 150 and an additional OLED material 112. The shadowing of the second overhang 109 provides for evaporation deposition of each of the HIL material 150, the additional OLED material 112, and a cathode 114. As further discussed in the corresponding description of FIG. 1B, the overhang structures 110 and the evaporation angle set by the evaporation source define the first HIL angle $\theta_{HIL1}$ and second HIL angle $\theta_{HIL2}$ (shown in FIG. 1B) of the HIL material 150, the first OLED angle $\theta_{OLED1}$ and the second $\theta_{OLED2}$ (shown in FIG. 1B) of the additional OLED material 112, and the cathode angle $\theta_{cathode}$ (shown in FIG. 1B) of the cathode 114. I.e., the overhang structures 110 provide for a shadowing effect during evaporation deposition with the evaporation angle set by the evaporation source configured to emit the deposition material at a particular angle with regard to the overhang structure 110. The first and second HIL angles $\theta_{HIL1}$, $\theta_{HIL2}$ of the HIL material 150, the first and second OLED angles $\theta_{OLED1}$, $\theta_{OLED2}$ of the additional OLED material 112 and the cathode angle $\theta_{cathode}$ of the cathode 114 result from evaporation deposition of the HIL material 150, the additional OLED material 112, and the cathode 114.

In one embodiment, the additional OLED material 112 contacts a first portion 170 of the body extension 117A and the cathode 114 is disposed over the additional OLED material 112 and contacts a second portion 172 of the body extension 117A. The HIL material 150 contacts the upper surface 103 (as shown in FIG. 1B) of the PDL structure 126 and the body extension 117A. The additional OLED material 112 separates the HIL material 150 on the PDL structure 126 from the HIL material 150 disposed on the body extension 117A. In another embodiment, the HIL material 150 does not contact the body extension 117A. The encapsulation layer 116 is deposited over the cathode 114. The encapsulation layer 116 extends to contact the cathode 114 that is disposed over the additional OLED material 112. The encapsulation layer 116 extends to contact the cathode 114 at the second portion 172 of the body extension 117A. The encapsulation layer 116 extends to contact the body structure 110A at a third portion 173 of the body extension 117A. The encapsulation layer 116 extends to contact the top structure 110B at an underside surface of the top extension 109A. The encapsulation layer 116 extends over a top surface 115 of the top structure 110b. In embodiments including capping layers, the capping layers are deposited between the cathode 114 and the encapsulation layer 116. The capping layers may be deposited by evaporation deposition. Embodiments may also include a global passivation layer 120 disposed over the encapsulation layer 116.

FIG. 4A shows a schematic, cross-sectional view of a sub-pixel circuit 400 according embodiments. In one embodiment, the sub-pixel circuit 400 includes a line-type architecture. The line-type architecture includes a plurality of pixel openings. Each of pixel opening is abutted by overhang structures 110 that define each of the sub-pixels 106 of the line-type architecture. In another embodiment, the sub-pixel circuit 400 includes a dot-type architecture. The dot-type architecture includes a plurality of pixel openings. Each of pixel opening is surrounded by overhang structures 110 that define each of the sub-pixels 106 of the dot-type architecture.

The sub-pixel circuit 400 includes a substrate 102. At least one metal-containing layer 404 is disposed over the substrate 102 and is defined by adjacent pixel-defining layer (PDL) structures 126 disposed over the substrate 102. In one embodiment, the at least one metal containing layer 404 is disposed on the substrate 102 and the PDL structures 126 are disposed on the substrate 102. The at least one metal-containing layer 404 is pre-patterned on the substrate 102, e.g., the substrate 102 is pre-patterned with metal-containing layers 404 of indium tin oxide (ITO). The at least one metal-containing layer 404 is a layer stack of a first transparent conductive oxide (TCO) layer 404B, a second metal-containing layer 404A is disposed on the first TCO layer and a third TCO layer 404C disposed on the second metal-containing layer. The at least one metal-containing layer 404 is configured to operate as anodes of respective sub-pixels. The material of the second metal-containing layer 404B includes, but is not limited to, chromium, titanium, gold, silver, copper, aluminum, ITO, a combination thereof, or other suitably conductive materials.

The plurality of PDL structures 126 are disposed over the substrate 102. The PDL structures 126 include one of an organic material, an organic material with an inorganic coating disposed thereover, or an inorganic material. The organic material of the PDL structures 126 includes, but is not limited to, polyimides. The inorganic material of the PDL structures 126 includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent PDL structures 126 define a respective sub-pixel and expose the anode (i.e., metal-containing layer 404) of the respective sub-pixel of the sub-pixel circuit 400.

The sub-pixel circuit 400 has a plurality of sub-pixels 106 including at least a first sub-pixel 108A and a second sub-pixel 108B. While the Figures depict the first sub-pixel 108A and the second sub-pixel 108B, the sub-pixel circuit 400 of the embodiments described herein may include two or more sub-pixels 106, such as a third and a fourth sub-pixel. Each sub-pixel 106 has OLED materials configured to emit a white, red, green, blue or other color light when energized. E.g., the OLED materials of the first sub-pixel 108A emits a red light when energized, the OLED materials of the second sub-pixel 108B emits a green light when energized, the OLED materials of a third sub-pixel emits a blue light when energized, and the OLED materials of a fourth sub-pixel emits a other color light when energized The overhang structures 110 are permanent to the sub-pixel circuit 400. The overhang structures 110 further define each sub-pixel 106 of the sub-pixel circuit 400. The overhang structures 110 include adjacent first overhangs 117 and adjacent second overhangs 109. Each of the first overhangs 117 is defined by a PDL extension 126A (as shown in FIG. 4B) of the plurality of adjacent PDL structures 126 extending laterally past the base structure 110C. The base structure 110C is disposed over an upper surface of the metal-containing layer 404, and the PDL extension 126A is disposed over the base structure 110C. In one embodiment, the PDL extension 126A is disposed on the base structure 110C. The PDL structure 126 further includes a PDL body 126B, the PDL body 126B being disposed over the substrate 102. The overhang structure 110 further includes a body structure 110A disposed over the upper surface 103 of the PDL structure 126 (as shown in FIG. 4B). The second overhangs 109 further include at least a top structure 110B disposed over a body structure 110A. In one embodiment, the top structure 110B is disposed on the body structure 110A. In one embodiment, the overhang structures 110 includes the top structure 110B of a non-conductive inorganic material and the body structure 110A of a conductive inorganic material. In another embodiment, the overhang structures 110 includes the top structure 110B of a conductive inorganic material and the body structure 110A of a conductive inorganic material. The conductive materials of the body structure 110A include aluminum (Al), aluminum neodymium (AlNd), molybdenum (Mo), molybdenum tungsten (MoW), copper (Cu), or combinations thereof. The inorganic materials of the top structure include titanium (Ti), silicon nitride ($Si_3N_4$), silicon oxide ($SiO_2$), silicon oxynitride ($Si_2N_2O$), or combinations thereof. The base structure 110C includes a metal-containing material or an inorganic material. In one example, the metal-containing material is a transparent conductive oxide (TCO) material. The TCO material includes, but is not limited to, indium zinc oxide (IZO), indium tin oxide (ITO), indium gallium zinc oxide (IGZO), or combinations thereof. The overhang structures 110 are able to remain in place, i.e., are permanent.

The adjacent first overhangs 117 are defined by the PDL extension 126A of a PDL structure 126 extending laterally past the base structure 110C. At least a bottom surface 127 of the PDL extension 126A is wider than a top surface 119 of a base structure 110C. The base structure 110C is disposed over the at least one metal-containing layer 404. The PDL extension 126A of the PDL structure 126 forms the first overhang 117 and allows for the PDL structure 126 to shadow the at least one metal-containing layer 404. The shadowing of the first overhang 117 provides for evaporation deposition of OLED materials. The OLED materials may include one or more of a HIL, a HTL, an EML, and an ETL. A HIL material 150 of the OLED materials is disposed over and in contact with the at least one metal-containing layer 404 and the PDL extension 126A. In one embodiment, the HIL material 150 is different from the material of the body structure 110A, the top structure 110B, and base structure 110C. The HIL material 150 is disposed over and in contact with the at least one metal-containing layer 404 and disposed under the adjacent first overhangs 117, extending to a first HIL endpoint 161. An additional OLED material 112 is disposed over the HIL material 150 and extends under the adjacent first overhang 117. In one embodiment, the additional OLED material 112 is disposed on the HIL material 150. In the illustrated embodiment, the HIL material 150 extends under the adjacent first overhang 117 to a first HIL endpoint 161 past a first OLED endpoint 157. In another embodiment, e.g., as shown in FIGS. 1A and 1B as applied to the sub-pixel circuit 400, the additional OLED material 112 extends to contact the at least one metal-containing layer 404 past the first HIL endpoint 161 under the adjacent first overhang 117. In one embodiment, the additional OLED material 112 is different from the material of the body structure 110A, the body structure 110B, and the base structure 110C. The first overhang 117 and the evaporation angle set by the evaporation source defines a first HIL angle $\theta_{HIL1}$ of the HIL material 150 and a first OLED angle $\theta_{OLED1}$ of the additional OLED material 112. The first HIL angle $\theta_{HIL1}$ of the HIL material 150 and first OLED angle $\theta_{OLED1}$ of the additional OLED material 112 result from the overhang structures 110 and evaporation deposition of the HIL material 150 and the additional OLED material 112. I.e., the overhang structures 110 provide for a shadowing effect during evaporation deposition with the evaporation angle set by the evaporation source configured to emit the deposition material at a particular angle with regard to the overhang structure 110.

Adjacent second overhangs 109 are defined by a top extension 109A of the top structure 110B. At least a bottom surface 107 of the top structure 110B is wider than a top surface 105 of the body structure 110A to form the top extension 109A of the second overhang 109. The top structure 110B is disposed over a top surface 105 of the body structure 110A. The top extension 109A of the top structure 110B forms the second overhang 109 and allows for the top structure 110B to shadow the body structure 110A. The shadowing of the second overhang 109 provides for evaporation deposition of each of the HIL material 150, the additional OLED material 112, and the cathode 114. The HIL material 150 is disposed over a portion of the PDL extension 126A. The additional OLED material 112 extends to contact the body structure 110A at a second OLED endpoint 158 past a second HIL endpoint 162 of the HIL material 150 on the PDL extension 126A and is disposed over a first portion 170 of the sidewall 111 of the body structure 110A. A cathode 114 is disposed over the additional OLED material 112, extending under the adjacent second overhangs 109 and contacting a second portion 172 of the body structure 110A. The second overhangs 109 and the evaporation angle set by the evaporation source define a second HIL angle $\theta_{HIL2}$ of the HIL material 150, a second OLED angle $\theta_{OLED2}$ of the additional OLED material 112 and a cathode angle $\theta_{cathode}$ of the cathode 114. The second HIL angle $\theta_{HIL2}$ of the HIL material 150, second OLED angle $\theta_{OLED2}$ of the additional OLED material 112 and the cathode angle $\theta_{cathode}$ of the cathode 114 may result from overhang structure 110 and the evaporation deposition of the HIL material 150, the additional OLED material 112, and the cathode 114 under the second overhang 109. I.e., the overhang structures 110 provide for a shadowing effect during evaporation deposition with the evaporation angle set by the evaporation source configured to emit the deposition material at a particular angle with regard to the overhang structure 110. In one embodiment, the additional OLED material 112 and the cathode 114 contact the body structure 110A while the HIL material 150 does not contact the body structure 110A. In another embodiment, the HIL material layer 150, the additional OLED material 112, and the cathode 114 contact the body structure 110A.

In one embodiment, the HIL material 150, the additional OLED material 112, and the cathode 114 are disposed over a portion of the sidewall 128 of the PDL extension 126A and a portion of the sidewall 111 of the body structure 110A. In another embodiment, the HIL material is disposed over a portion of the sidewall 128 of the PDL extension 126A but not disposed on the sidewall 111 of the body structure 110A. The portion of the additional OLED material 112 that is disposed under the adjacent first overhang 117 separates the HIL material 150 disposed on the at least one metal-containing layer 404 and the HIL material 150 disposed on the PDL extension 126A. The discontinuation breaks a direct path through the HIL material 150 from the at least one metal-containing layer 404 to the conductive material of the body structure 110A. Therefore, the HIL material 150 does not continuously connect the conductive material of the body structure 110A to the at least one metal-containing layer 404. Thus, when the input current flows to the metal-containing layer 404 and subsequently to the HIL material 150, the current flows through the additional OLED material 112 to the cathode 114 and illuminates the sub-pixels 106. If the HIL material 150 continuously connected the conductive material of the body structure 110A to the metal-containing layer 404, a portion of the current would flow from the HIL material 150 to the body structure 110A and would bypass the additional OLED material 112. In another embodiment, the HIL material 150 is not disposed on the PDL extension 126A. Therefore, there is no direct connection from the at least one metal-containing layer 404 to the body structure 110A through the HIL material 150 and the current therefore flows through the additional OLED material 112 to the cathode 114, illuminating the additional OLED material 112.

The cathode 114 includes a conductive material, such as a metal. E.g., the cathode 114 includes, but is not limited to, silver, magnesium, chromium, titanium, aluminum, ITO, or a combination thereof. In one embodiment, material of the cathode 114 is different from the material of the body structure 110A, the top structure 110B, and base structure 110C. In the illustrated embodiments as shown in FIGS. 4A and 4B, the HIL material 150, the additional OLED material 112 and the cathode 114 are disposed over a sidewall 113 of the top structure 110B and a top surface 115 of the top structure 110B of the overhang structures 110. In some embodiments, e.g. as shown in FIGS. 1A and 1B as applied to sub-pixel 400, the HIL material 150, the additional OLED material 112, and the cathode 114 end on the sidewall 111 of the body structure 110A, i.e., are not disposed over the sidewall 113 of the top structure 110B or the top surface 115 of the top structure 110B.

Each sub-pixel 106 includes include an encapsulation layer 116. The encapsulation layer 116 may be or may correspond to a local passivation layer. The encapsulation layer 116 of a respective sub-pixel is disposed over the cathode 114 (and additional OLED material 112) with the encapsulation layer 116 extending under at least a portion of each of the overhang structures 110 and along a sidewall of each of the overhang structures 110. The encapsulation layer 116 is disposed over the cathode 114 and extends at least to contact the cathode 114 over the second portion 172 of the sidewall 111 of the body structure 110A. In some embodiments, the encapsulation layer 116 extends to contact the conductive material of the body structure 110A at a third portion 173 of the sidewall 111 of the body structure 110A. In the illustrated embodiments of FIGS. 4A and 4B, the encapsulation layer 116 extends to contact an inorganic material of the top structure 110B at an underside surface of the top extension 109A and to be disposed over the HIL material 150, the additional OLED material 1112, and the cathode 114 when the HIL material 150, the additional OLED material 112, and cathode 114 are disposed over the sidewall 113 of the top structures 110B and the top surface 115 of the top structure 110B. In some embodiments, e.g., as shown in FIGS. 1A and 1B as applied to sub-pixel 400, the encapsulation layer 116 extends to contact an inorganic material of the top structure 110B at an underside surface of the top extension 109A, the sidewall 113 of the top structure 110B, and the top surface 115 of the top structure 110B. In some embodiments, e.g., as shown in FIGS. 8A and 8B as applied to sub-pixel 400, the encapsulation layer ends at the sidewall 111 of the body structure 110A, i.e., is not disposed over the sidewall 113 of the top structure 110B, the top surface 115 of the top structure 110B, or the underside surface of the top extension 109A of the overhang structures 110. The encapsulation layer 116 includes the non-conductive inorganic material, such as the silicon-containing material. The silicon-containing material may include $Si_3N_4$ containing materials.

In embodiments including one or more capping layers, the capping layers are disposed between the cathode 114 and the encapsulation layer 116. E.g., a first capping layer and a second capping layer are disposed between the cathode 114 and the encapsulation layer 116. Each of the embodiments described herein may include one or more capping layers disposed between the cathode 114 and the encapsulation layer 116. The first capping layer may include an organic material. The second capping layer may include an inorganic material, such as lithium fluoride. The first capping layer and the second capping layer may be deposited by evaporation deposition. In another embodiment, the sub-pixel circuit 400 further includes at least a global passivation layer 120 disposed over the overhang structure 110 and the encapsulation layer 116. In yet another embodiment, the sub-pixel includes an intermediate passivation layer disposed over the overhang structures 110 of each of the sub-pixels 106, and disposed between the encapsulation layer 116 and the global passivation layer 120.

FIG. 4B is a schematic, cross-sectional view of an overhang structure 110 of a sub-pixel circuit 400 according to embodiments. The PDL extension 126A includes a first underside edge 174 and a first overhang vector 153. The top extension 117A includes a second underside edge 152 and a second overhang vector 154. The first underside edge 174 extends past the first HIL endpoint 161. The first overhang vector 153 is defined by the first underside edge 174 and the at least one metal-containing layer 404. The HIL material 150 is disposed over the at least one metal-containing layer 404 and over a portion of the PDL extension 126A, extending under the first overhang 117 to the first HIL endpoint 161. The additional OLED material 112 is disposed over the HIL material 150 and the HIL material 150 extends to a first HIL endpoint 161 past a first OLED endpoint 157 under the first overhang 117.

In one embodiment, the second underside edge 152 extends past the first underside edge 174. In another embodiment, the first underside edge 174 extends past the second underside edge 152. The second overhang vector 154 is defined by the second underside edge 152 and the PDL structure 126. The additional OLED material 112 is disposed over the at least one metal-containing layer 104 and over a portion of the PDL structure 126. In one embodiment, the HIL material 150 is disposed over the at least one metal-containing layer 404 and over a portion of the PDL extension 126A, extending under the second overhang 109 to a second HIL endpoint 162. The additional OLED material 112 is disposed over the HIL material 150 and extends over the body structure 110A pasta second HIL endpoint 162 of the HIL material 150 under the second overhang 109. In one embodiment, the additional OLED material contacts the body structure 110A. In another embodiment, the HIL material 150 is disposed over a portion of the sidewall 111 of the body structure 110A under the second overhang 109. The HIL material 150 forms a second HIL angle $\theta_{HIL2}$ between a second HIL vector 160 and the second overhang vector 154. The second HIL vector 160 is defined by the second HIL endpoint 162 extending under the second overhang 109, the second underside edge 152 of the top structure 110B, and the angle set by the evaporation source. An additional OLED material 112 is disposed over the HIL material 150 and forms a second OLED angle $\theta_{OLED2}$ between a second OLED vector 156 and the second overhang vector 154.

The second OLED vector 156 is defined by a second OLED endpoint 158 extending under the second overhang 109 the second underside edge 152 of the top extension 117A, and the angle set by the additional OLED material source (not shown). The additional OLED material 112 is disposed over a first portion 170 of the sidewall 111 of the body structure 110A.

The cathode 114 is disposed over the additional OLED material 112. In some embodiments, the cathode 114 is disposed on a second portion 172 of the sidewall 111 of the body structure 110A. The cathode 114 forms a cathode angle $\theta_{cathode}$ between a cathode vector 164 and the second overhang vector 154. The cathode vector 164 is defined by a cathode edge 166 at least extending under the second overhang 109 the second underside edge 152 of the top structure 110B, and the angle set by the evaporation source. The encapsulation layer 116 is disposed over the cathode 114 (and additional OLED material 112) with the encapsulation layer 116 extending at least under the top structure 110B of the overhang structure 110 and contacting a third portion 173 of the sidewall 111 of the body structure 110A.

During evaporation deposition of the additional OLED material 112, the first and second underside edge 174, 152 define the position of the first and second OLED endpoints 157, 158, e.g., the additional OLED material 112 is evaporated at an OLED maximum angle that corresponds to the first and second OLED vectors 155, 156 and the first and second underside edges 174, 152 ensure that the additional OLED material 112 is not deposited past the first and second OLED endpoints 157, 158. In embodiments with the HIL material 150, the first and second underside edges 174, 152 define the position of the first and second HIL endpoints 161, 162, e.g., the HIL material 150 is evaporated at an HIL maximum angle that corresponds to the first and second HIL vectors 159, 160 and the first and second underside edges 174, 152 ensure that the HIL material 150 is not deposited past the first and second HIL endpoints 161, 162. In one embodiment, the second HIL endpoint 162 is on the sidewall 111 of the body structure 110A, allowing for the deposition of the HIL material 150 on the body structure 110A. In another embodiment, the second HIL endpoint 162 is on the PDL extension 126, and no HIL material 150 is deposited on the body structure 110A. During evaporation deposition of the cathode 114, the second underside edge 152 of the top structure 110B defines the position of the cathode edge 166, e.g., the cathode 114 is evaporated at a cathode maximum angle that corresponds to the cathode vector 164 and the second underside edge 152 ensures that the cathode 114 is not deposited past the cathode edge 166. The second OLED angle $\theta_{OLED2}$ is less than the cathode angle $\theta_{cathode}$. In one embodiment, the first and second HIL angles $\theta_{HIL1}$ and $\theta_{HIL2}$ are less than the first and second OLED angles $\theta_{OLED1}$ and $\theta_{OLED2}$, respectively. In another embodiment, the first and second OLED angles $\theta_{OLED1}$ and $\theta_{OLED2}$ are less than the first and second HIL angles $\theta_{HIL1}$ and $\theta_{HIL2}$.

Figure 5:
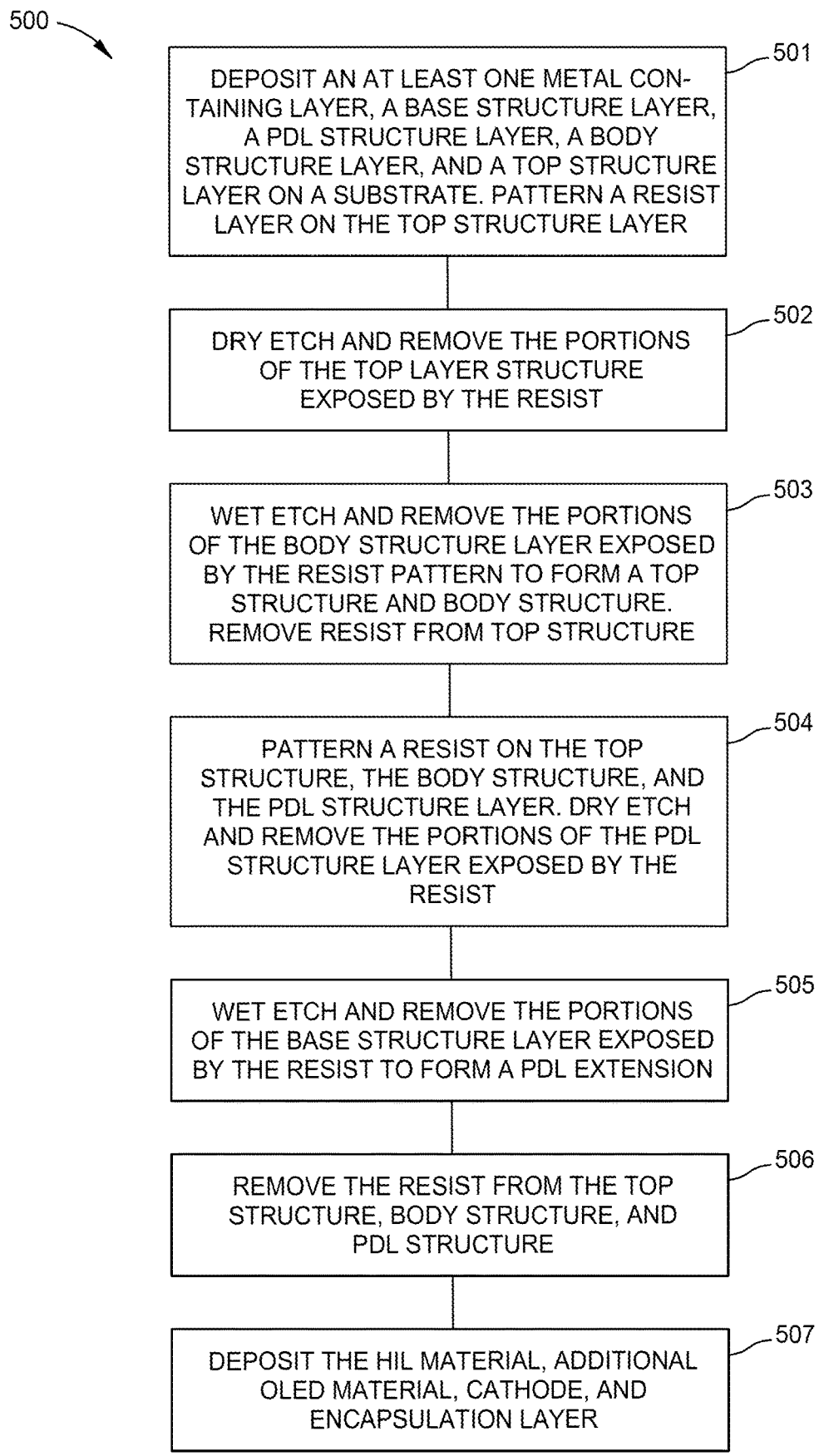
FIG. 5 is a flow diagram of a method for forming a sub-pixel according to embodiments.

FIG. 5 is a flow diagram of a method 500 for forming a sub-pixel circuit 100 according to embodiments. FIGS. 6A-6F are schematic, cross-sectional views of a substrate 102 during the method 500 for forming the sub-pixel circuit 400 according embodiments described herein.

At operation 501, as shown in FIG. 6A, a body structure layer 602A and a top structure layer 602B are deposited over a PDL structure 126. The base structure layer 602C is disposed over the at least one metal-containing layer 404. In one embodiment, the metal-containing layer is an at least one metal-containing layer 404. The at least one metal-containing layer 404 is a layer stack of a first TCO layer 404B, a second metal-containing layer 404A disposed on the first TCO layer 404B, and a third TCO layer 404C disposed on the second metal-containing layer 404A. The base structure layer 602C is disposed on the third TCO layer 404C. The at least one metal-containing layer 404 is disposed over a substrate 102. In one embodiment, the at least one metal-containing layer 404 is disposed on the substrate 102. The PDL structure layer 626 includes a PDL extension 626A and a PDL body 626B. The PDL extension 626A is disposed over the base structure layer 602C. The PDL body 626B is disposed over the substrate 102. In one embodiment, the PDL body 626B is disposed on the substrate 102. The body structure layer 602A is disposed over the PDL structure layer 626. The top structure layer 602B is disposed over the body structure layer 602A. The body structure layer 602A corresponds to the body structure 110A of the overhang structures 110. The top structure layer 602B corresponds to the top structure 110B of the overhang structures 110. The base structure layer 602C corresponds to the base structure 110C of the overhang structures 110. In one embodiment, a resist 606 is disposed and patterned. The resist 606 is disposed over the top structure layer 602B. The resist 606 is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the resist 606 determines whether the resist is a positive resist or a negative resist. The portion of the top structure layer 602B that has the resist 606 is patterned to form one of a pixel opening 124A of the dot-type architecture or a pixel opening 124B of the line-type architecture of a first sub-pixel 108A. The patterning is one of a photolithography, digital lithography process, or laser ablation process.

At operation 502, as shown in FIG. 6B, portions of the top structure layer 602B exposed by the pixel opening 124A, 124B are removed. The top structure layer 602B exposed by the pixel opening 124A, 124B may be removed a dry etch process. Operation 502 forms the top structure 110B.

At operation 503, as shown in FIG. 6C, portions of the body structure layer 602A that are exposed by the pixel opening 124A, 124B, are removed. The body structure layer 602A exposed by the pixel opening 124A, 124B may be removed by a wet etch process. Operation 503 forms the top structure 110B and the body structure 110A of the overhang structures 110 of the first sub-pixel 108A. The etch selectivity between the materials of the top structure layer 602B corresponding to the top structure 110B and the body structure layer 602A corresponding to the body structure 110A, and the etch processes to remove the exposed portions of the top structure layer 602B, the body structure layer 602A provide for the bottom surface 107 of the top structure 110B being wider than the top surface 105 of the body structure 110A to form a top extension 109A of the second overhang 109 (as shown in FIGS. 4A and 4B). The resist 606 is then removed from the top structure 110B (not shown).

At operation 504, as shown in FIG. 6D, a resist 608 is disposed and patterned. The resist 608 is patterned to form one of a pixel opening 124A of the dot-type architecture 101C or a pixel opening 124B of the line-type architecture 101D of a first sub-pixel 108A. The patterning is one of a photolithography, digital lithography process, or laser ablation process. The resist 608 is disposed over the top structure 110B, the body structure 110A, and the PDL structure layer 626. The PDL structure layer 626 exposed by the resist 608 are removed using a dry etch process.

At operation 505, as shown in FIG. 6E, portions of the base structure layer 602C that are exposed by the pixel opening 124A, 124B, are removed. The base structure layer 602C exposed by the resist may be removed by a wet etch process. The etch selectivity between the materials of the base structure layer 602C corresponding to the base structure 110C, and the etch processes to remove the exposed portions of the PDL structure layer 626 provide for the bottom surface 127 of the PDL structure layer 626 being wider than the top surface 119 of the base structure 110C to form a PDL extension 126A of the first overhang 117 (as shown in FIGS. 4A and 4B). The shadowing of the first overhang 117 provide for evaporation deposition the HIL material 150, the additional OLED material 112 and the cathode 114 under the first overhang.

At operation 506, as shown in FIG. 6F, the resist 608 is removed from the top structure 110B.

At operation 507, the OLED materials of the first sub-pixel 108A, the cathode 114, and the encapsulation layer 116 are deposited. The OLED materials includes the HIL material 150 and an additional OLED material 112. The shadowing of the second overhang 109 provides for evaporation deposition each of the HIL material 150, the additional OLED material 112, and a cathode 114. As further discussed in the corresponding description of FIG. 1B, the overhang structures 110 and the evaporation angle set by the evaporation source define the first and second HIL angles $\theta_{HIL1}$, $\theta_{HIL2}$ (shown in FIG. 4B) of the HIL material 150, the first and second OLED angles $\theta_{OLED1}$, $\theta_{OLED2}$ (shown in FIG. 4B) of the additional OLED material 112, and the cathode angle $\theta_{cathode}$ (shown in FIG. 4B) of the cathode 114. I.e., the overhang structures 110 provide for a shadowing effect during evaporation deposition with the evaporation angle set by the evaporation source configured to emit the deposition material at a particular angle with regard to the overhang structure 110. The HIL angles of the HIL material 150, the OLED angles of the additional OLED material 112 and the cathode angle of the cathode 114 result from evaporation deposition of the HIL material 150, the additional OLED material 112, and the cathode 114.

The additional OLED material 112 is disposed over a first portion 170 of the body structure 110A and the cathode 114 is disposed over the additional OLED material 112. In one embodiment, the additional OLED material 112 contacts a first portion 170 of the body structures 110A and the cathode contacts a second portion 172 of the body structure 110A of the overhang structures 110. The HIL material 150 contacts the upper surface 103 of the PDL structure 126 and sidewall 128 of the PDL extension 126A. The additional OLED material 112 separates the HIL material 150 on the PDL structure 126 from the HIL material 150 disposed over the at least one metal-containing layer 104. In one embodiment, the HIL material 150 is disposed on the at least one metal-containing layer 104. The encapsulation layer 116 is deposited over the cathode 114. The encapsulation layer 116 is disposed over the cathode 114 that is disposed over the additional OLED material 112 at the first portion 170 of the body structure 110A. In another embodiment, the encapsulation layer 116 is disposed over the cathode 114 at the second portion 172 of the body structure 110A. In another embodiment, the encapsulation layer 116 extends to contact the body structure 110A at a third portion 173 of the body structure 110A. The encapsulation layer 116 extends to contact the top structure 110B at an underside surface of the top extension 109A. The encapsulation layer 116 extends over a top surface 115 of the top structure 110B. In embodiments including capping layers, the capping layers are deposited between the cathode 114 and the encapsulation layer 116. The capping layers may be deposited by evaporation deposition.

Figure 7A:
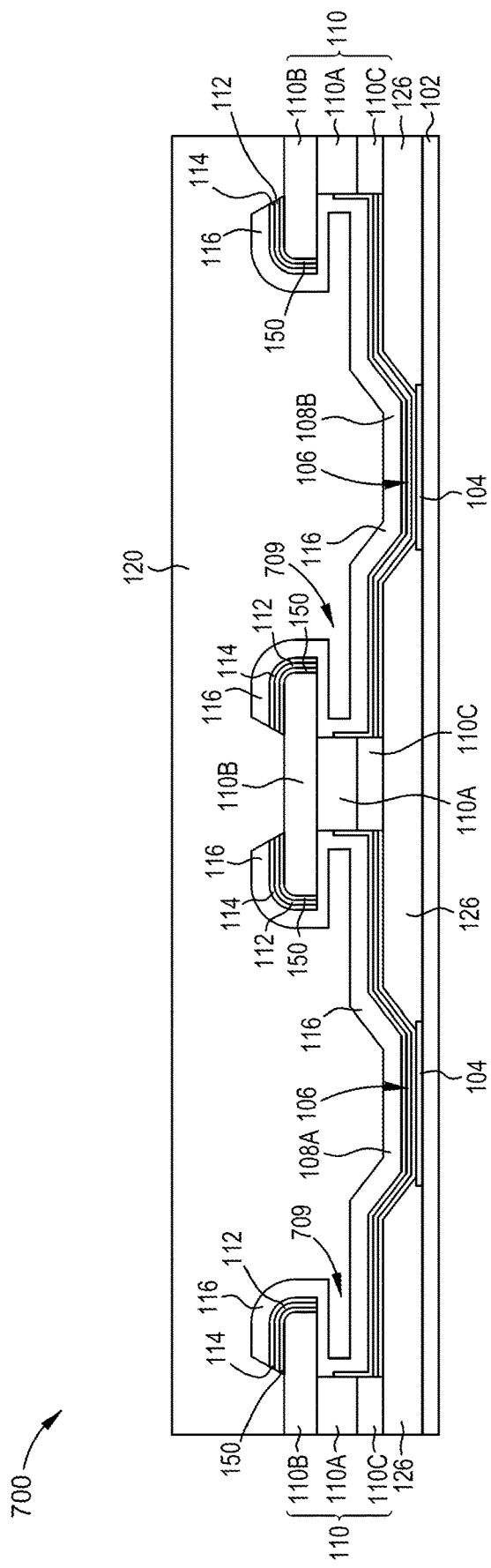
FIG. 7A is a schematic, cross-sectional view of a sub-pixel circuit according to embodiments.

FIG. 7A a schematic, cross-sectional view of a sub-pixel circuit 700 according to embodiments. The sub-pixel circuit 700 includes a substrate 102. In one embodiment, the sub-pixel circuit 700 includes a line-type architecture. The line-type architecture includes a plurality of pixel openings. Each of pixel opening is abutted by overhang structures 110 that define each of the sub-pixels 106 of the line-type architecture. In another embodiment, the sub-pixel circuit 700 includes a dot-type architecture. The dot-type architecture includes a plurality of pixel openings. Each of pixel opening is surrounded by overhang structures 110 that define each of the sub-pixels 106 of the dot-type architecture. A metal-containing layer 104 may be patterned on the substrate 102 and is defined by adjacent pixel-defining layer (PDL) structures 126 disposed over the substrate 102. In one embodiment, the PDL structures 126 are disposed on the substrate 102. The metal-containing layer 104 is pre-patterned on the substrate 102, e.g., the substrate 102 is pre-patterned with metal-containing layers 104 of indium tin oxide (ITO). The metal-containing layer 104 is configured to operate as anodes of respective sub-pixels. In one embodiment, the metal-containing layer 104 is a layer stack of a first transparent conductive oxide (TCO) layer, a second metal-containing layer disposed on the first TCO layer and a third TCO layer disposed on the second metal-containing layer. The material of the metal-containing layer 104 includes, but is not limited to, chromium, titanium, gold, silver, copper, aluminum, ITO, a combination thereof, or other suitably conductive materials.

The plurality of PDL structures 126 are disposed over the substrate 102. The PDL structures 126 include one of an organic material, an organic material with an inorganic coating disposed thereover, or an inorganic material. The organic material of the PDL structures 126 includes, but is not limited to, polyimides. The inorganic material of the PDL structures 126 includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent PDL structures 126 define a respective sub-pixel and expose the anode (i.e., metal-containing layer 104) of the respective sub-pixel of the sub-pixel circuit 700.

The sub-pixel circuit 700 has a plurality of sub-pixels 106 including at least a first sub-pixel 108A and a second sub-pixel 1086. While the Figures depict the first sub-pixel 108A and the second sub-pixel 108B, the sub-pixel circuit 700 of the embodiments described herein may include two or more sub-pixels 106, such as a third and a fourth sub-pixel. Each sub-pixel 106 has OLED materials configured to emit a white, red, green, blue or other color light when energized. E.g., the OLED materials of the first sub-pixel 108A emits a red light when energized, the OLED materials of the second sub-pixel 108B emits a green light when energized, the OLED materials of a third sub-pixel emits a blue light when energized, and the OLED materials of a fourth sub-pixel emits a other color light when energized.

The overhang structures 110 are permanent to the sub-pixel circuit 700. The overhang structures 110 further define each sub-pixel 106 of the sub-pixel circuit 700. The overhang structures 110 include at least a top structure 110B disposed over a body structure 110A and the body structure 110A disposed over the base structure 110C. In one embodiment, the top structure is disposed on the body structure 110A and the body structure 110A is disposed on the base structure 110C. The base structure 110C is disposed over the PDL structure 126. In one embodiment, the base structure 110C is disposed on the PDL structure 126. The body structure 110A includes a conductive inorganic material. The top structure 110B includes a polymeric, an inorganic, or a metal material. The conductive materials of the body structure 110A include aluminum (Al), aluminum neodymium (AlNd), molybdenum (Mo), molybdenum tungsten (MoW), copper (Cu), or combinations thereof. The inorganic materials of the top structure include titanium (Ti), silicon nitride ($Si_3N_4$), silicon oxide ($SiO_2$), silicon oxynitride ($Si_2N_2O$), or combinations thereof. The base structure 110C includes a nonconductive material.

Adjacent overhangs 709 each define a top extension 109A of the top structure 110B extending laterally past the base structure 110C and the body structure 110A. At least a bottom surface 107 of the top structure 110B is wider than a top surface 105 of the body structure 110A to form the top extension 109A of the overhang 709. The top structure 110B is disposed over a top surface 105 of the body structure 110A. The top extension 109A of the top structure 110B forms the overhang 709 and allows for the top structure 110B to shadow the body structure 110A. The overhang structures 110 and an evaporation angle set by an evaporation source define deposition angles, i.e., the overhang structures 110 provide for a shadowing effect during evaporation deposition with the evaporation angle set by the evaporation source. The shadowing of the overhang 709 provides for evaporation deposition of each of the OLED materials and a cathode 114. The OLED materials may include one or more of a HIL, a HTL, an EML, and an ETL. A HIL material 150 of the OLED materials is disposed over and in contact with the metal-containing layer 104 and extends to a HIL endpoint 762 on the PDL structure 126. In one embodiment, the HIL material 150 is different from the material of the body structure 110A, the top structure 110B, and base structure 110C. An additional OLED material 112 is disposed over the HIL material 150. In one embodiment, the additional OLED material 112 is disposed on the HIL material 150. In one embodiment, the additional OLED material 112 is different from the material of the body structure 110A, the body structure 110B, and the base structure 110C. The additional OLED material 112 is disposed over the HIL material 150 extending under the overhang 709 to an OLED endpoint 758 past the HIL endpoint 762 of the HIL material 150 and in contact with a first portion 775 of the base structure 110C. A cathode 114 is disposed over the additional OLED material 112, extending under the adjacent overhangs 709 to a cathode edge 166 and contacting a second portion 776 of the base structure 110C. In this embodiment, the additional OLED material 112 and the HIL material 150 do not contact the body structure 110A. In another embodiment, the additional OLED material 112 extends to contact the body structure 110A and the cathode 114 is disposed over the additional OLED material 112 and extends to contact the body portion 110A. The overhang structures 110 and the evaporation angle set by the evaporation source define a HIL angle $\theta_{HIL}$ of the HIL material 150, an OLED angle $\theta_{OLED}$ of the additional OLED material 112 and a cathode angle $\theta_{cathode}$ of the cathode 114. The HIL angle $\theta_{HIL}$ of the HIL material 150, OLED angle $\theta_{OLED}$ of the additional OLED material 112 and the cathode angle $\theta_{cathode}$ of the cathode 114 may result from the overhang structure 110 and the evaporation deposition of the HIL material 150, the additional OLED material 112, and the cathode 114. I.e., the overhang structures 110 provide for a shadowing effect during evaporation deposition with the evaporation angle set by the evaporation source configured to emit the deposition material at a particular angle with regard to the overhang structure 110. In another embodiment, the additional OLED material 112 and the cathode 114 contact the body structure 110A of the overhang structures 110, while the HIL material 150 does not contact the body structure. In another embodiment, the HIL material 150 does not does not contact a portion of the base structure 110C. The discontinuation breaks a direct path through the HIL material 150 from the metal-containing layer 104 to the conductive material of the body structure 110A. Therefore, the HIL material 150 does not continuously connect the conductive material of the body structure 110A to the metal-containing layer 104. Thus, when the input current flows to the metal-containing layer 104 and subsequently to the HIL material 150, the current flows through the additional OLED material 112 to the cathode 114 and illuminates the sub-pixels 106. If the HIL material 150 continuously connected the conductive material of the body structure 110A to the metal-containing layer 104, a portion of the current would flow from the HIL material 150 to the body structure 110A and would bypass the additional OLED material 112.

The cathode 114 includes a conductive material, such as a metal. E.g., the cathode 114 includes, but is not limited to, silver, magnesium, chromium, titanium, aluminum, ITO, or a combination thereof. In one embodiment, material of the cathode 114 is different from the material of the body structure 110A, the top structure 110B, and base structure 110C. In the illustrated embodiments of 7A and 7B, the HIL material 150, the additional OLED material 112 and the cathode 114 are disposed over a sidewall 113 of the top structure 110B of the overhang structures 110 and over a top surface 115 of the top structure 110B of the overhang structures 110. In some embodiments, e.g., as shown in FIGS. 8A and 8B as applied to sub-pixel 700, the HIL material 150, the additional OLED material 112, and the cathode 114 end on the sidewall 111 of the body structure 110A, i.e., are not disposed over the top surface 115 of the top structure 110B of the overhang structures 110.

Each sub-pixel 106 includes include an encapsulation layer 116. The encapsulation layer 116 may be or may correspond to a local passivation layer. The encapsulation layer 116 of a respective sub-pixel is disposed over the cathode 114 (and additional OLED material 112) with the encapsulation layer 116 extending under at least a portion of each of the overhang structures 110 and along a sidewall of each of the overhang structures 110. The encapsulation layer 116 is disposed over the cathode 114 and extends at least to contact the cathode 114 over the second portion of the sidewall 111 of the body structure 110A. In some embodiments, the encapsulation layer 116 extends to contact the conductive material of the body structure 110A. In the illustrated embodiments of 7A and 7B, the encapsulation layer 116 extends to contact an inorganic material of the top structure 110B at an underside surface of the top extension 109A and to be disposed over the HIL material 150, the additional OLED material 112, and the cathode 114 when the HIL material 150, the additional OLED material 112, and the cathode 114 are disposed over the sidewall 113 of the top structure 110B, and the top surface 115 of the top structure 110B. In some embodiments, e.g., as shown in FIGS. 1A and 1B, the encapsulation layer 116 extends to contact an inorganic material of the top structure 110B at an underside surface of the top extension 109A, the sidewall 113 of the top structure 110B, and the top surface 115 of the top structure 110B. In some embodiments, e.g., as shown in FIGS. 8A and 8B as applied to sub-pixel 700, the encapsulation layer 116 ends at the sidewall 111 of the body structure 110A, i.e., is not disposed over the sidewall 113 of the top structure 110B, the top structure 110B of the overhang structures 110, or the underside surface of the top extension 109A. The encapsulation layer 116 includes the non-conductive inorganic material, such as the silicon-containing material. The silicon-containing material may include $Si_3N_4$ containing materials.

In embodiments including one or more capping layers, the capping layers are disposed between the cathode 114 and the encapsulation layer 116. E.g., a first capping layer and a second capping layer are disposed between the cathode 114 and the encapsulation layer 116. Each of the embodiments described herein may include one or more capping layers disposed between the cathode 114 and the encapsulation layer 116. The first capping layer may include an organic material. The second capping layer may include an inorganic material, such as lithium fluoride. The first capping layer and the second capping layer may be deposited by evaporation deposition. In another embodiment, the sub-pixel circuit 700 further includes at least a global passivation layer 120 disposed over the overhang structure 110 and the encapsulation layer 116. In yet another embodiment, the sub-pixel includes an intermediate passivation layer disposed over the overhang structures 110 of each of the sub-pixels 106, and disposed between the encapsulation layer 116 and the global passivation layer 120.

Figure 7B:
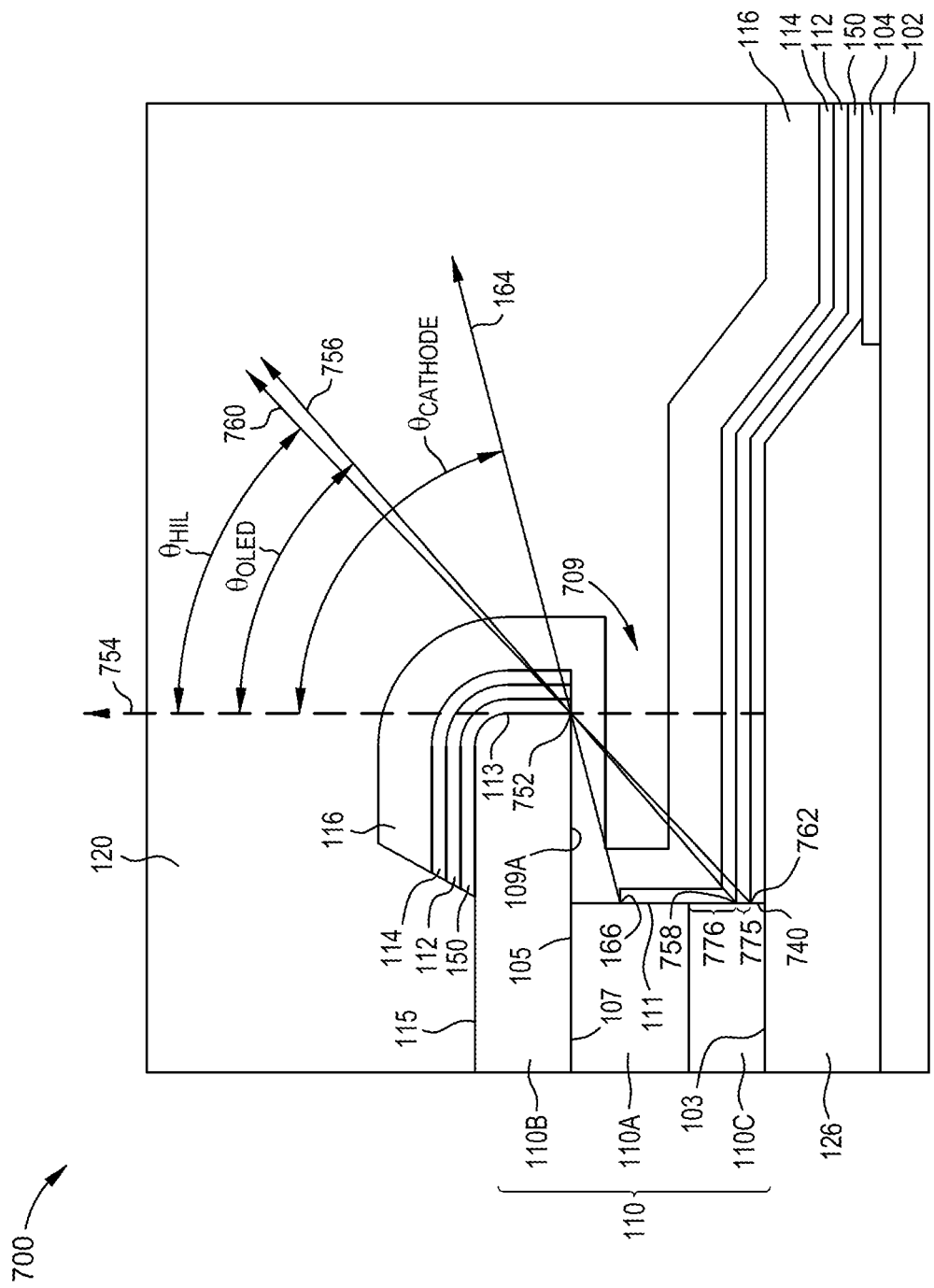
FIG. 7B is a schematic, cross-sectional view of an overhang structure of a sub-pixel circuit according to embodiments.

FIG. 7B is a schematic, cross-sectional view of an overhang structure 110 of a sub-pixel circuit 700. The top structure 110B includes an underside edge 752 and an overhang vector 754. In one embodiment, the underside edge 752 extends past the sidewall 740 of the base structure 110C. In another embodiment, the sidewall 740 of the base structure 110C extends past the underside edge 752. The overhang vector 754 is defined by the underside edge 752 and the PDL structure 126. The additional OLED material 112 is disposed over the metal-containing layer 104 and over a portion of the PDL structure 126. In one embodiment, the HIL material 150 is disposed over the metal-containing layer 104 and over a portion of the PDL structure 126. The additional OLED material 112 is disposed over the HIL material 150 and extends to contact the base structure 110C at the OLED endpoint 758 past a HIL endpoint 762 of the HIL material 150 under the overhang 709. In one embodiment, the HIL material 150 is disposed over a portion of the sidewall 740 of the base structure 110C under the overhang 709. The HIL material 150 forms an HIL angle $\theta_{HIL}$ between a HIL vector 760 and the overhang vector 754. The HIL vector 760 is defined by the HIL endpoint 762 extending under the overhang 709, the underside edge 752 of the top extension 109A, and the angle set by the evaporation source. An additional OLED material 112 is disposed over the HIL material 150 and forms an OLED angle $\theta_{OLED}$ between an OLED vector 756 and the overhang vector 754. The OLED vector 756 is defined by the OLED endpoint 758 extending under the overhang 709, the underside edge 752 of the top extension 109A, and angle set by the evaporation source. The additional OLED material is disposed over a first portion 775 of the sidewall 740 of the base structure 110C.

The cathode 114 is disposed over the additional OLED material 112. In some embodiments, the cathode 114 is disposed on a second portion 776 of the sidewall 740 of the base structure 110C. The cathode 114 forms a cathode angle $\theta_{cathode}$ between a cathode vector 164 and the overhang vector 754. The cathode vector 164 is defined by a cathode edge 166 at least extending under the overhang 709, the underside edge 752 of the top extension 109A, and the angle set by the evaporation source. The encapsulation layer 116 is disposed over the cathode 114 (and additional OLED material 112) with the encapsulation layer 116 extending at least under the top structure 1106 of the overhang structure 110 and contacting a the body structure 110A.

During evaporation deposition of the additional OLED material 112, the underside edge 752 of the top extension 109A defines the position of the OLED endpoint 758, e.g., the additional OLED material 112 is evaporated at an OLED maximum angle that corresponds to the OLED vector 756 and the underside edge 752 ensures that the additional OLED material 112 is not deposited past the OLED endpoint 758. The underside edge 752 of the top extension 109A defines the position of the HIL endpoint 762, e.g., the HIL material 150 is evaporated at an HIL maximum angle that corresponds to the HIL vector 760 and the underside edge 752 ensures that HIL material 150 is not deposited past the HIL endpoint 762. In one embodiment, the HIL endpoint 762 is on the sidewall 740 of the base structure 110C, allowing for the deposition of the HIL material 150 on the base structure 110C. In another embodiment, the HIL endpoint 762 is on the PDL structure 126, and no HIL material 150 is deposited on the base structure 110C. During evaporation deposition of the cathode 114, the underside edge 752 of the top extension 109A defines the position of the cathode edge 166, e.g., the cathode 114 is evaporated at a cathode maximum angle that corresponds to the cathode vector 164 and the underside edge 752 ensures that the cathode 114 is not deposited past the cathode edge 166. The OLED angle $\theta_{OLED}$ is less than the cathode angle $\theta_{cathode}$. In one embodiment, the HIL angle $\theta_{HIL}$ is less than the OLED angle $\theta_{OLED}$. In another embodiment, the OLED angle $\theta_{OLED}$ is less than the HIL angle $\theta_{HIL}$.

FIG. 8A a schematic, cross-sectional view of a sub-pixel circuit 800 according to embodiments. The sub-pixel circuit 800 includes a substrate 102. In one embodiment, the sub-pixel circuit 800 includes a line-type architecture. The line-type architecture includes a plurality of pixel openings. Each of pixel opening is abutted by overhang structures 110 that define each of the sub-pixels 106 of the line-type architecture. In another embodiment, the sub-pixel circuit 800 includes a dot-type architecture. The dot-type architecture includes a plurality of pixel openings. Each of pixel opening is surrounded by overhang structures 110 that define each of the sub-pixels 106 of the dot-type architecture. A metal-containing layer 104 may be patterned on the substrate 102 and is defined by adjacent first pixel-defining layer (PDL) structures 826 disposed over the substrate 102. The metal-containing layer 104 is an at least one metal-containing layer. The metal-containing layer 104 is pre-patterned on the substrate 102, e.g., the substrate 102 is pre-patterned with metal-containing layers 104 of indium tin oxide (ITO). In one embodiment, the metal-containing layer 104 is a layer stack of a first transparent conductive oxide (TCO) layer, a second metal-containing layer disposed on the first TCO layer and a third TCO layer disposed on the second metal-containing layer. The metal-containing layer 104 is configured to operate as anodes of respective sub-pixels. The material of the metal-containing layer 104 includes, but is not limited to, chromium, titanium, gold, silver, copper, aluminum, ITO, a combination thereof, or other suitably conductive materials.

The first PDL structures 826 include one of an organic material, an organic material with an inorganic coating disposed thereover, or an inorganic material. The organic material of the first PDL structures 826 includes, but is not limited to, polyimides. The inorganic material of the first PDL structures 826 includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent first PDL structures 826 define a respective sub-pixel and expose the anode (i.e., metal-containing layer 104) of the respective sub-pixel of the sub-pixel circuit 800.

The sub-pixel circuit 800 has a plurality of sub-pixels 106 including at least a first sub-pixel 108A and a second sub-pixel 108B. While the Figures depict the first sub-pixel 108A and the second sub-pixel 108B, the sub-pixel circuit 800 of the embodiments described herein may include two or more sub-pixels 106, such as a third and a fourth sub-pixel. Each sub-pixel 106 has OLED materials configured to emit a white, red, green, blue or other color light when energized. E.g., the OLED materials of the first sub-pixel 108A emits a red light when energized, the OLED materials of the second sub-pixel 108B emits a green light when energized, the OLED materials of a third sub-pixel emits a blue light when energized, and the OLED materials of a fourth sub-pixel emits a other color light when energized The overhang structures 110 are permanent to the sub-pixel circuit 800. The overhang structures 110 further define each sub-pixel 106 of the sub-pixel circuit 800. The overhang structures 110 include at least a top structure 1106 disposed over a body structure 110A and the body structure 110A is disposed over a second PDL structure 828. In one embodiment, the top structure 1106 is disposed on the body structure 110A and the body structure 110A is disposed on the second PDL structure 828. The second PDL structure 828 is disposed over the upper surface of the first PDL structure 826. In one embodiment, the second PDL structure 828 is disposed on the upper surface of the first PDL structure 826. In one embodiment, the overhang structures 110 includes the top structure 1106 of a non-conductive inorganic material and the body structure 110A of a conductive inorganic material. In another embodiment, the overhang structures 110 includes the top structure 1106 of a conductive inorganic material and the body structure 110A of a conductive inorganic material. The conductive materials of the body structure 110A include aluminum (Al), aluminum neodymium (AlNd), molybdenum (Mo), molybdenum tungsten (MoW), copper (Cu), or combinations thereof. The inorganic materials of the top structure 1106 include titanium (Ti), silicon nitride ($Si_3N_4$), silicon oxide ($SiO_2$), silicon oxynitride ($Si_2N_2O$), or combinations thereof. The second PDL structure 828 includes a non-conductive material. In one embodiment, the first and second PDL structure 826, 828 include the same material, e.g., silicon nitride. In another embodiment, the first PDL structure 826 includes a different material than the second PDL structure 828, e.g., the first PDL structure includes silicon nitride and the second PDL structure 828 includes silicon oxynitride. The overhang structures 110 are able to remain in place, i.e., are permanent. Thus, organic material from lifted off overhang structures that disrupt OLED performance would not be left behind. Eliminating the need for a lift-off procedure also increases throughput.

Adjacent overhangs 809 each define a top extension 109A of the top structure 1106 extending laterally past the body structure 110A. At least a bottom surface 107 of the top structure 1106 is wider than a top surface 105 of the body structure 110A to form the top extension 109A of the overhang 809. The top structure 1106 is disposed over a top surface of the body structure 110A. The top extension 109A of the top structure 1106 forms the overhang 809 and allows for the top structure 1106 to shadow the body structure 110A. The overhang structures 110 and an evaporation angle set by an evaporation source define deposition angles, i.e., the overhang structures 110 provide for a shadowing effect during evaporation deposition with the evaporation angle set by the evaporation source. The shadowing of the overhang 809 provides for evaporation deposition of each of an OLED material and a cathode 114. The OLED materials may include one or more of a HIL, a HTL, an EML, and an ETL. A HIL material 150 of the OLED materials is disposed over and in contact with the metal-containing layer 104 and extending to a HIL endpoint 862 on the first PDL structure 826. In one embodiment, the HIL material 150 is different from the material of the body structure 110A, the top structure 1106, and base structure 110C. An additional OLED material 112 is disposed over the HIL material 150. In one embodiment, the additional OLED material 112 is disposed on the HIL material 150. In one embodiment, the additional OLED material 112 is different from the material of the body structure 110A, the body structure 1106, and the base structure 110C. The additional OLED material 112 extends to contact the second PDL structure 828 at an OLED endpoint 858 past the HIL endpoint 862 of the HIL material 150 and is disposed over a first portion 875 of the second PDL structure 828. A cathode 114 is disposed over the additional OLED material 112, extending under the adjacent overhangs 809 and contacting a second portion of the second PDL structure 828. In one embodiment, the cathode 114 is not in contact with the second PDL structure 828. The overhang structures 110 and the evaporation angle set by the evaporation source define a HIL angle $\theta_{HIL}$ of the HIL material 150, an OLED angle $\theta_{OLED}$ of the additional OLED material 112 and a cathode angle $\theta_{cathode}$ of the cathode 114. The HIL angle $\theta_{HIL}$ of the HIL material 150, OLED angle $\theta_{OLED}$ of the additional OLED material 112 and the cathode angle $\theta_{cathode}$ of the cathode 114 may result from the overhang structure 110 and the evaporation deposition of the HIL material 150, the additional OLED material 112, and the cathode 114. I.e., the overhang structures 110 provide for a shadowing effect during evaporation deposition with the evaporation angle set by the evaporation source configured to emit the deposition material at a particular angle with regard to the overhang structure 110. In one embodiment, the additional OLED material 112, and the cathode 114 contact the body structure 110A of the overhang structures 110 while the HIL material 150 does not contact the body structure 110A. In another embodiment, the cathode 114 contacts the body structure 110A while the HIL material 150 and the additional OLED material 112 do not contact the body structure 110A. The HIL material 150 does not, in any embodiment, contact the conductive material of the body structure 110A. The discontinuation breaks a direct path through the HIL material 150 from the metal-containing layer 104 to the conductive material of the body structure 110A. Therefore, the HIL material 150 does not continuously connect the conductive material of the body structure 110A to the metal-containing layer 104. Thus, when the input current flows to the metal-containing layer 104 and subsequently to the HIL material 150, the current flows through the additional OLED material 112 to the cathode 114 and illuminates the sub-pixels 106. If the HIL material 150 continuously connected the conductive material of the body structure 110A to the metal-containing layer 104, a portion of the current would flow from the HIL material 150 to the body structure 110A and would bypass the additional OLED material 112.

The cathode 114 includes a conductive material, such as a metal. E.g., the cathode 114 includes, but is not limited to, chromium, titanium, aluminum, ITO, or a combination thereof. In one embodiment, material of the cathode 114 is different from the material of the body structure 110A, the top structure 110B, and base structure 110C. In another embodiment, the cathode 114 and the additional OLED material 112 are disposed over a portion of the body structure 110A. In another embodiment, the cathode 114 is disposed over a portion of the body structure 110A while the additional OLED material 112 is not disposed over a portion of the body structure. In some embodiments, e.g., as shown in FIGS. 7A and 7B as applied to sub-pixel circuit 800, additional OLED material 112 and the cathode 114 are disposed over a sidewall 113 of the top structure 110B of the overhang structures 110 and over a top surface 115 of the top structure 110B of the overhang structures 110. In the illustrated embodiments 8A and 8B, the HIL material 150, the additional OLED material 112, and the cathode 114 end on the sidewall 111 of the body structure 110A, i.e., are not disposed over the top surface 115 of the top structure 110B of the overhang structures 110.

Each sub-pixel 106 includes include an encapsulation layer 116. The encapsulation layer 116 may be or may correspond to a local passivation layer. The encapsulation layer 116 of a respective sub-pixel is disposed over the cathode 114 (and additional OLED material 112) with the encapsulation layer 116 extending under at least a portion of each of the overhang structures 110 and along a sidewall of each of the overhang structures 110. The encapsulation layer 116 is disposed over the cathode 114 and extends at least to contact the cathode 114 over the second portion of the sidewall 829 of the second PDL structure 828. In some embodiments, the encapsulation layer 116 extends to contact the conductive material of the body structure 110A. In some embodiments, e.g., as shown in FIGS. 4A and 4B as applied to sub-pixel 800, the encapsulation layer 116 extends to contact an inorganic material of the top structure 110B at an underside surface of the top extension 109A and to be disposed over the HIL material 150, the additional OLED material 112, and the cathode 114 when the HIL material 150, the additional OLED material 112, and the cathode 114 are disposed over the sidewall 113 of the top structure 110B, and the top surface 115 of the top structure 110B. In some embodiments, e.g., as shown in FIGS. 1A and 1B, the encapsulation layer 116 extends to contact an inorganic material of the top structure 110B at an underside surface of the top extension 109A, the sidewall 113 of the top structure 110B, and the top surface 115 of the top structure 110B. In the illustrated embodiments of 8A and 8B, the encapsulation layer 116 ends at a sidewall of the 111 of the body structure 110A, i.e., is not disposed over the sidewall 113 of the top structure 110B, the top surface 115 of the top structure 110B of the overhang structures 110, or the underside surface of the top extension 109A. The encapsulation layer 116 includes the non-conductive inorganic material, such as the silicon-containing material. The silicon-containing material may include $Si_3N_4$ containing materials.

In embodiments including one or more capping layers, the capping layers are disposed between the cathode 114 and the encapsulation layer 116. E.g., a first capping layer and a second capping layer are disposed between the cathode 114 and the encapsulation layer 116. Each of the embodiments described herein may include one or more capping layers disposed between the cathode 114 and the encapsulation layer 116. The first capping layer may include an organic material. The second capping layer may include an inorganic material, such as lithium fluoride. The first capping layer and the second capping layer may be deposited by evaporation deposition. In another embodiment, the sub-pixel circuit 100 further includes at least a global passivation layer 120 disposed over the overhang structure 110 and the encapsulation layer 116. In yet another embodiment, the sub-pixel includes an intermediate passivation layer disposed over the overhang structures 110 of each of the sub-pixels 106, and disposed between the encapsulation layer 116 and the global passivation layer 120.

FIG. 8B is a schematic, cross-sectional view of an overhang structure 110 of a sub-pixel circuit 800. The top structure 110B includes an underside edge 852 and an overhang vector 854. The overhang vector 854 is defined by the underside edge 852 and the first PDL structure 826. In one embodiment, the HIL material 150 is disposed over the metal-containing layer 104 and over a portion of the first PDL structure 826. The additional OLED material 112 is disposed over the HIL material 150 and extends to the OLED endpoint 858 past the HIL endpoint 862 of the HIL material 150. In one embodiment, the HIL material 150 is disposed over a portion of the sidewall 829 of the second PDL structure 828 under the overhang 809. The HIL material 150 forms an HIL angle $\theta_{HIL}$ between a HIL vector 860 and the overhang vector 854. The HIL vector 860 is defined by the HIL endpoint 862 extending under the overhang 809, the underside edge 852 of the top extension 109A, and the angle set by the evaporation source. An additional OLED material 112 is disposed over the HIL material 150 and forms an OLED angle $\theta_{LED}$ between an OLED vector 856 and the overhang vector 854. The OLED vector 856 is defined by the OLED endpoint 858 extending under the second overhang 109, the underside edge 852 of the top extension 109A, and the angle set by the evaporation source. The additional OLED material 112 is disposed over a first portion 875 of the sidewall 829 of the second PDL structure 828.

The cathode 114 is disposed over the additional OLED material 112. In some embodiments, the cathode 114 is disposed on a second portion of the sidewall 829 of the second PDL structure 828. The cathode 114 forms a cathode angle $\theta_{cathode}$ between a cathode vector 164 and the overhang vector 854. The cathode vector 164 is defined by a cathode edge 166 at least extending under the overhang 809, the underside edge 852 of the top structure 1106, and a position of a cathode source. The encapsulation layer 116 is disposed over the cathode 114 (and additional OLED material 112) with the encapsulation layer 116 extending at least under the top structure 1106 of the overhang structure 110 and contacting a portion the conductive material of the body structure 110A.

During evaporation deposition of the additional OLED material 112, the underside edge 852 of the top extension defines the position of the OLED endpoint 858, e.g., the additional OLED material 112 is evaporated at an OLED maximum angle that corresponds to the OLED vector 856 and the underside edge 852 ensures that the additional OLED material 112 is not deposited past the OLED endpoint 858. In one embodiment, the additional OLED material 112 is deposited on a first portion 875 of the sidewall 829 of the second PDL structure 828. In another embodiment, the additional OLED material is deposited on a portion of the body structure 110A. During deposition of the HIL material 150, the underside edge 852 of the top extension 109A defines the position of the HIL endpoint 862, e.g., the HIL material 150 is evaporated at an HIL maximum angle that corresponds to the HIL vector 860 and the underside edge 852 ensures that HIL material 150 is not deposited past the HIL endpoint 862. In one embodiment, the HIL endpoint 862 is on the sidewall 829 of the second PDL structure 828, allowing for the deposition of the HIL material 150 on the second PDL structure 828. In another embodiment, the HIL endpoint 862 is on the first PDL structure 826, and no HIL material 150 is deposited on the second PDL structure 828 structure and the additional OLED material 112 is deposited on the first PDL structure 826. During evaporation deposition of the cathode 114, the underside edge 852 of the top structure 1106 defines the position of the cathode edge 166, e.g., the cathode 114 is evaporated at a cathode maximum angle that corresponds to the cathode vector 164 and the underside edge 852 ensures that the cathode 114 is not deposited past the cathode edge 166. In one embodiment, the cathode 114 is disposed on a second portion of the sidewall 829 of the second PDL structure 828. In one embodiment, the cathode 114 is not disposed on the second PDL structure 828. The OLED angle $\theta_{OLED}$ is less than the cathode angle $\theta_{cathode}$. In one embodiment, the HIL angle $\theta_{HIL}$ is less than the OLED angle $\theta_{OLED}$. In another embodiment, the OLED angle $\theta_{OLED}$ is less that the HIL angle $\theta_{HIL}$.

In embodiments including one or more capping layers, the capping layers are disposed between the cathode 114 and the encapsulation layer 116. E.g., a first capping layer and a second capping layer are disposed between the cathode 114 and the encapsulation layer 116. Each of the embodiments described herein may include one or more capping layers disposed between the cathode 114 and the encapsulation layer 116. The first capping layer may include an organic material. The second capping layer may include an inorganic material, such as lithium fluoride. The first capping layer and the second capping layer may be deposited by evaporation deposition. In another embodiment, the sub-pixel circuit 800 further includes at least a global passivation layer 120 disposed over the overhang structure 110 and the encapsulation layer 116. In yet another embodiment, the sub-pixel includes an intermediate passivation layer disposed over the overhang structures 110 of each of the sub-pixels 106, and disposed between the encapsulation layer 116 and the global passivation layer 120.

In summation, described herein relate to sub-pixel circuits and methods of forming sub-pixel circuits that may be utilized in a display such as an organic light-emitting diode (OLED) display. The adjacent overhang structures defining each sub-pixel of the sub-pixel circuit of the display provide for formation of the sub-pixel circuit using evaporation deposition and provide for the overhang structures to remain in place after the sub-pixel circuit is formed. Evaporation deposition may be utilized for deposition of a HIL material, an additional OLED material and cathode. The overhang structures define deposition angles, i.e., the overhang structures provide for a shadowing effect during evaporation deposition with the evaporation angle set by the evaporation source for each of the HIL material, the additional OLED material, and the cathode. The encapsulation layer of a respective sub-pixel is disposed over the cathode with the encapsulation layer extending under at least a portion of each of the adjacent overhang structures and along a sidewall of each of the adjacent overhang structures.

While the foregoing is directed to embodiments of the present disclosure, other and further embodiments of the disclosure may be devised without departing from the basic scope thereof, and the scope thereof is determined by the claims that follow.

What is claimed is:

1. A device, comprising:
   a substrate;
   a plurality of adjacent pixel-defining layer (PDL) structures disposed over the substrate, wherein each PDL structure comprises an upper surface; and
   a plurality of sub-pixels, each sub-pixel comprising:
   adjacent first overhangs, each first overhang defined by a body extension of a body structure extending laterally past a base structure, the base structure disposed over the upper surface of the PDL structure, and the body structure disposed over the base structure;
   adjacent second overhangs, each second overhang defined by a top extension of a top structure extending laterally past an overhang portion of body extension, the top structure disposed over the body structure;
   an anode;
   a hole injection layer (HIL) material disposed over and in contact with the anode and disposed under the adjacent second overhangs;
   an additional organic light emitting diode (OLED) material disposed over the HIL material, wherein the additional OLED material extends under the adjacent first overhangs to contact the PDL structure past an endpoint of the HIL material; and
   a cathode disposed over the additional OLED material, the cathode extending under the adjacent second overhangs and contacting a second portion of the body extension.

2. The device of claim 1, wherein the HIL material is disposed over and in contact with the anode and is disposed under the adjacent first and second overhangs such that the HIL contacts the body extension, wherein a portion of the additional OLED material disposed under the adjacent first overhangs separates the HIL material disposed over the anode and the HIL material on the body extension.

3. The device of claim 1, wherein an encapsulation layer is disposed over the cathode, wherein the encapsulation layer extends:
   to contact the cathode over the second portion of the body extension; and
   to contact a conductive material of the body structure at a third portion of the body extension.

4. The device of claim 1, wherein the body structure comprises a conductive material of at least one of a metal or metal alloy.

5. The device of claim 1, wherein the top structure comprises an inorganic material.

6. The device of claim 1, wherein the additional OLED material extends to contact the anode past an endpoint of the HIL material.

7. The device of claim 1, wherein the HIL material extends to contact the anode past an endpoint of the additional OLED material.

8. The device of claim 1, wherein the base structure comprises a metal containing material.

9. The device of claim 1, wherein an encapsulation layer is disposed over the cathode, wherein the encapsulation layer extends:
to contact a conductive material of the body structure.

10. The device of claim 1, wherein the anode is a layer stack of a first transparent conductive oxide (TCO) layer, a second metal layer disposed over the first TCO layer, and a third TCO layer disposed over the second metal layer, wherein the base structure is disposed over the upper surface of the third TCO layer.

11. The device of claim 1, wherein the additional OLED material is disposed over a first portion of the body extension.

12. A device, comprising:
a substrate;
a plurality of adjacent pixel-defining layer (PDL) structures disposed over the substrate, wherein each PDL structure comprises an upper surface; and
a plurality of sub-pixels, each sub-pixel comprising:
adjacent first overhangs, each first overhang defined by a body extension of a body structure extending laterally past a base structure, the base structure disposed over the upper surface of the PDL structure, and the body structure disposed over the base structure;
adjacent second overhangs, each second overhang defined by a top extension of a top structure extending laterally past an overhang portion of body extension, the top structure disposed over the body structure;
an anode;
a hole injection layer (HIL) material disposed over and in contact with the anode and disposed under the adjacent second overhangs;
an additional organic light emitting diode (OLED) material disposed over the HIL material, wherein the additional OLED material extends under the adjacent first overhangs and wherein the HIL material extends to contact the PDL structure past an endpoint of the additional OLED material; and
a cathode disposed over the additional OLED material, the cathode extending under the adjacent second overhangs and contacting a second portion of the body extension.

13. The device of claim 12, wherein the body structure comprises one of aluminum (Al), Aluminum neodymium (AlNd), molybdenum (Mo), molybdenum tungsten (MoW), copper (Cu), or combinations thereof.

14. The device of claim 12, wherein an encapsulation layer is disposed over the cathode, wherein the encapsulation layer extends:
to contact the cathode over the body structure; and
to contact the body structure.

15. A device, comprising:
a substrate;
a plurality of adjacent pixel-defining layer (PDL) structures disposed over the substrate, wherein each PDL structure comprises an upper surface; and
a plurality of sub-pixels, each sub-pixel comprising:
adjacent first overhangs, each first overhang defined by a body extension of a body structure extending laterally past a base structure, the base structure disposed over the upper surface of the PDL structure, and the body structure disposed over the base structure;
adjacent second overhangs, each second overhang defined by a top extension of a top structure extending laterally past an overhang portion of body extension, the top structure disposed over the body structure;
an anode;
a hole injection layer (HIL) material disposed over and in contact with the anode and disposed under the adjacent second overhangs;
an additional organic light emitting diode (OLED) material disposed over the HIL material, wherein:
the additional OLED material extends under the adjacent first overhangs to contact the PDL structure past an endpoint of the HIL material; or
the HIL material extends to contact the PDL structure past an endpoint of the additional OLED material; and
a cathode disposed over the additional OLED material, the cathode extending under the adjacent second overhangs and contacting a second portion of the body extension.

16. The device of claim 15, wherein the base structure comprises a metal containing material or an inorganic material.

17. The device of claim 8, wherein the metal containing material is a transparent conductive oxide (TCO) material.

18. The device of claim 15, wherein the body structure comprises a conductive material of at least one of a metal or a metal alloy.

19. The device of claim 15, where in the top structure comprises an inorganic material.

20. The device of claim 15, wherein the additional OLED material is disposed over a first portion of the body extension.

21. The device of claim 16, wherein the metal containing material is a transparent conductive oxide (TCO) material.

22. The device of claim 15, wherein the HIL material is disposed over and in contact with the anode and is disposed under the adjacent first and second overhangs such that the HIL contacts the body extension, wherein a portion of the additional OLED material disposed under the adjacent first overhangs separates the HIL material disposed over the anode and the HIL material on the body extension.

23. The device of claim 15, wherein an encapsulation layer is disposed over the cathode, wherein the encapsulation layer extends:
to contact the cathode over the second portion of the body extension; and
to contact a conductive material of the body structure at a third portion of the body extension.

24. The device of claim 15, wherein the additional OLED material extends to contact the anode past an endpoint of the HIL material.

25. The device of claim 15, wherein the HIL material extends to contact the anode past an endpoint of the additional OLED material.

26. The device of claim 25, wherein the anode is a layer stack of a first transparent conductive oxide (TCO) layer, a second metal layer disposed over the first TCO layer, and a third TCO layer disposed over the second metal layer, wherein the base structure is disposed over the upper surface of the third TCO layer.

27. The device of claim 15, wherein an encapsulation layer is disposed over the cathode, wherein the encapsulation layer extends:
to contact a conductive material of the body structure.

* * * * *